(12) United States Patent
Nomura et al.

(10) Patent No.: US 10,962,573 B2
(45) Date of Patent: Mar. 30, 2021

(54) CURRENT SENSOR DEVICE

(71) Applicant: DENSO CORPORATION, Kariya (JP)

(72) Inventors: Kohsuke Nomura, Kariya (JP); Ryosuke Sakai, Kariya (JP); Takuma Esaka, Kariya (JP); Tatsuaki Sugito, Kariya (JP)

(73) Assignee: DENSO CORPORATION, Kariya (JP)

( * ) Notice: Subject to any disclaimer, the term of this patent is extended or adjusted under 35 U.S.C. 154(b) by 193 days.

(21) Appl. No.: 16/376,131

(22) Filed: Apr. 5, 2019

(65) Prior Publication Data

US 2019/0234996 A1 Aug. 1, 2019

Related U.S. Application Data

(63) Continuation of application No. PCT/JP2017/030225, filed on Aug. 24, 2017.

(30) Foreign Application Priority Data

Oct. 14, 2016 (JP) .............................. JP2016-202788
Mar. 6, 2017 (JP) .............................. JP2017-042063

(51) Int. Cl.
*G01R 15/20* (2006.01)
*H01R 9/22* (2006.01)
(Continued)

(52) U.S. Cl.
CPC ........ *G01R 15/207* (2013.01); *G01R 19/0092* (2013.01); *H01L 23/04* (2013.01); *H01L 23/552* (2013.01); *H01R 9/223* (2013.01); *H02J 7/1423* (2013.01); *H02M 1/00* (2013.01); *H01L 23/367* (2013.01); *H01L 23/4012* (2013.01); *H01R 2201/20* (2013.01); *H02J 7/143* (2020.01); *H02M 3/156* (2013.01); *H02M 7/003* (2013.01);
(Continued)

(58) Field of Classification Search
CPC ..... G01R 15/207; H01L 23/04; H01L 23/552; H02J 7/1423
See application file for complete search history.

(56) References Cited

U.S. PATENT DOCUMENTS

2010/0327949 A1 12/2010 Gotou
2011/0050222 A1* 3/2011 Ueno .................. G01R 15/207
324/253

(Continued)

FOREIGN PATENT DOCUMENTS

JP 2011-114966 A 6/2011
JP 2012-212776 A 11/2012
(Continued)

*Primary Examiner* — Dominic E Hawkins
(74) *Attorney, Agent, or Firm* — Posz Law Group, PLC

(57) ABSTRACT

A current sensor device includes a bus bar that is to be connected to a plate-shaped terminal of a semiconductor device, a magnetoelectric conversion element that is configured to detect a current flowing through the bus bar, and a resin portion that integrally holds the magnetoelectric conversion element and the bus bar. The bus bar has one end protruding from the resin portion, and the one end of the bus bar includes a penetration portion defined by wall surfaces. The wall surfaces includes a pair of opposing wall surfaces opposing to each other. At least one of the opposing wall surfaces is configured to be connected to the terminal.

11 Claims, 13 Drawing Sheets

(51) Int. Cl.
*H02J 7/14* (2006.01)
*H02M 1/00* (2006.01)
*G01R 19/00* (2006.01)
*H01L 23/552* (2006.01)
*H01L 23/04* (2006.01)
*H02M 3/156* (2006.01)
*H02M 7/797* (2006.01)
*H02P 27/06* (2006.01)
*H01L 23/367* (2006.01)
*H01L 23/40* (2006.01)
*H02M 7/00* (2006.01)

(52) U.S. Cl.
CPC .... *H02M 7/797* (2013.01); *H02M 2001/0009* (2013.01); *H02P 27/06* (2013.01)

(56) References Cited

U.S. PATENT DOCUMENTS

| | | | | |
|---|---|---|---|---|
| 2011/0068771 | A1* | 3/2011 | Ueno | G01R 15/202 |
| | | | | 324/117 R |
| 2011/0261600 | A1 | 10/2011 | Tachibana | |
| 2013/0040177 | A1* | 2/2013 | Hashio | H01M 2/30 |
| | | | | 429/93 |
| 2019/0025349 | A1* | 1/2019 | Sei | G01R 33/07 |

FOREIGN PATENT DOCUMENTS

| | | |
|---|---|---|
| JP | 2012-233741 A | 11/2012 |
| JP | 2015-033201 A | 2/2015 |
| WO | 2015/087433 A1 | 6/2015 |

\* cited by examiner

CURRENT SENSOR DEVICE

CROSS REFERENCE TO RELATED APPLICATIONS

The present application is a continuation application of International Patent Application No. PCT/JP2017/030225 filed on Aug. 24, 2017, which designated the U.S. and claims the benefit of priority from Japanese Patent Applications No. 2016-202788 filed on Oct. 14, 2016 and No. 2017-42063 filed on Mar. 6, 2017. The entire disclosures of all of the above applications are incorporated herein by reference.

TECHNICAL FIELD

The present disclosure relates to a current sensor device.

BACKGROUND

It has been known a current sensor device arranged on a semiconductor device including a switching element and a plate-shape terminal. The current sensor device includes a bus bar having one end connected to the terminal of the semiconductor device, a current sensor for detecting a current flowing in the bus bar, and a resin portion integrally holding the bus bar and the current sensor.

SUMMARY

The present disclosure provides a current sensor device to be disposed on a semiconductor device having a switching element and a plate-shaped terminal electrically connected to the switching element. The current sensor device includes a bus bar that is to be connected to the terminal, a magnetoelectric conversion element that is configured to detect a current flowing through the bus bar, and a resin portion that integrally holds the magnetoelectric conversion element and the bus bar. The bus bar has one end protruding from the resin portion, and the one end of the bus bar includes a penetration portion defined by wall surfaces. The wall surfaces includes a pair of opposing wall surfaces opposing to each other. At least one of the opposing wall surfaces is to be connected to the terminal.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
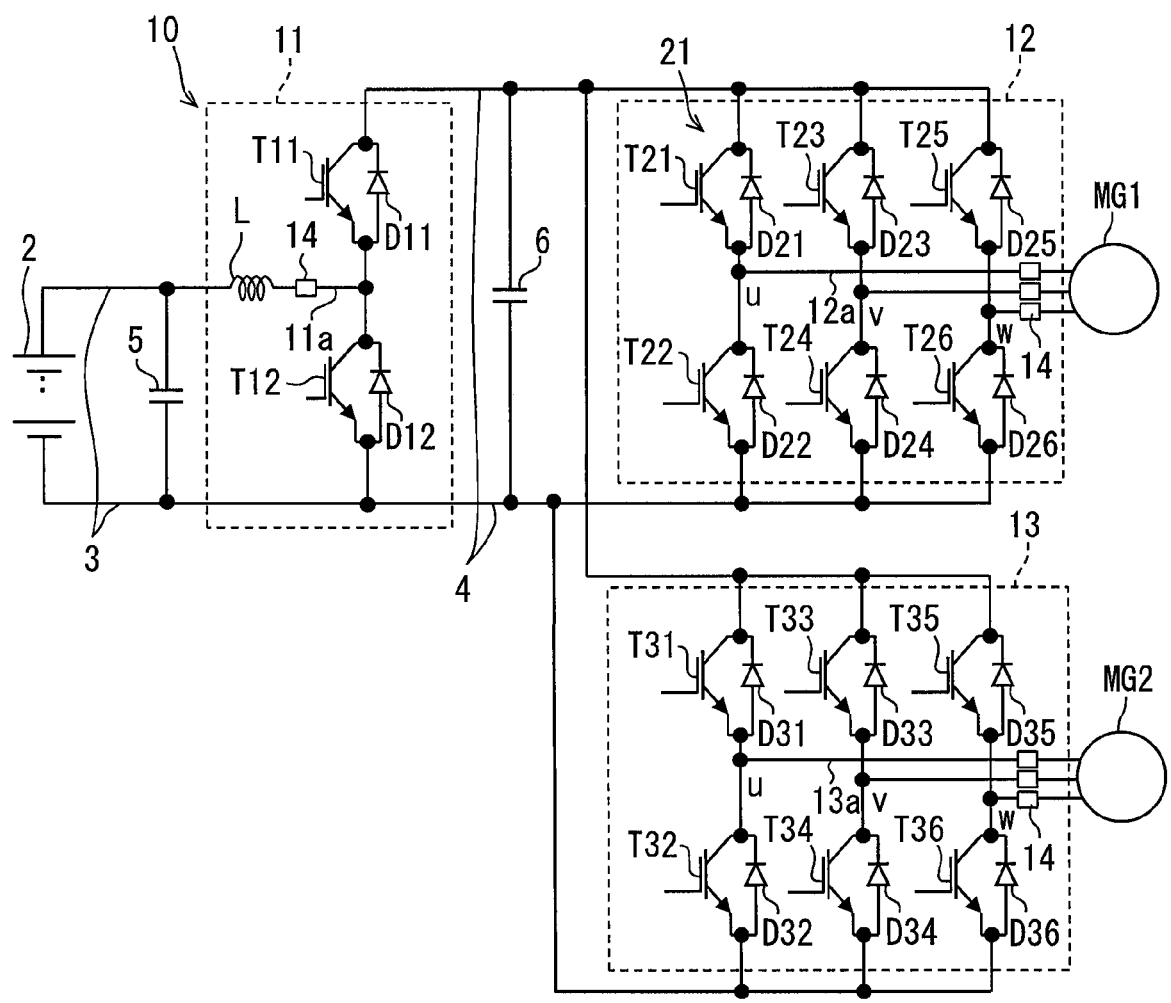
FIG. 1 is a diagram showing a schematic configuration of a power conversion device equipped with a current sensor device according to a first embodiment.

For example, a current sensor device is disposed on a semiconductor device, such as a power card, including a switching element and a plate-shaped terminal. The current sensor device includes a bus bar having one end connected to the terminal of the semiconductor device and the other end connected to a power cable for supplying an electric power to a motor, a current sensor that detects a current flowing through the bus bar, and a resin portion that integrally holds the bus bar and the current sensor. Such a current sensor device is also referred to as a bus bar module.

In such a current sensor device, for example, the bus bar and the terminal are connected to each other in the thickness direction of the terminal, such as by welding. In a case where the terminal and the bus bar are connected to each other in a state where the thickness direction of the terminal and the plate thickness direction of the bus bar are in the same direction, the position of the terminal may vary in the thickness direction of the terminal. In such a case, it is conceivable to press one end of the bus bar of the current sensor device and the terminal of the semiconductor device using a positioning member, such as a clamp, so as to connect to each other in a positioned state.

However, in a case where the bus bar is formed by pressing (punching) a metal plate, a burr is likely to be generated on one surface side in the plate thickness direction. In such a case, it is concerned to connect the terminal to a surface of the bus bar on which no burr is generated. However, an assembling property with the plate-shaped terminal is likely to be lowered.

According to a first aspect of the present disclosure, a current sensor device is to be disposed on a semiconductor device having a switching element and a plate-shaped terminal electrically connected to the switching element, and includes a bus bar, a magnetoelectric conversion element, and a resin portion. The bus bar is connected to the terminal in a thickness direction of the terminal. The magnetoelectric conversion element detects a current flowing through the bus bar. The resin portion integrally holds the magnetoelectric conversion element and the bus bar. The bus bar has, at one end protruding from the resin portion, a penetration portion defined by a wall surface and penetrating through the bus bar in a plate thickness direction of the bus bar, and a pair of opposing wall surfaces facing each other as the wall surface, and at least one of the pair of opposing wall surfaces is connected to the terminal.

According to the above current sensor device, the bus bar is provided with the penetration portion. Therefore, even if the position of the terminal varies in the thickness direction of the terminal, the terminal can be brought into contact with at least one of the pair of opposing wall surfaces that defines the penetration portion. As such, the bus bar can be positioned with respect to the terminal of the semiconductor device without using a positioning member such as a clamp.

In addition, since the wall surfaces of the penetration portion (opposing wall surfaces) are used as a connection surface with the terminal, even if the bus bar has a burr, the connection can be realized without being affected by the burr.

Accordingly, the assembling property of the current sensor device with the plate-shaped terminal of the semiconductor device can be improved.

According to a second aspect of the present disclosure, in the current sensor device according to the first aspect, the bus bar extends from one end to the other end opposite to the one end with the same plate thickness direction, that is, keeping the plate thickness direction constant.

According to the current sensor device, the bus bar is not provided with a bent portion in the plate thickness direction. For that reason, a variation in the position of the terminal (one end) due to the bent portion can be reduced. In other words, the assembling property of the current sensor device with the plate-shaped terminal can be further improved.

Embodiments of the present disclosure will be described in detail with reference to the drawings. In multiple embodiments, functionally and/or structurally corresponding parts are given the same reference numerals. In the following description, a plate thickness direction of one end of the bus bar is defined as a Z-direction, and an alignment direction of multiple bus bars is defined as an X-direction. The direction orthogonal to both of the Z-direction and the X-direction is defined as a Y-direction.

First Embodiment

First, a power conversion device will be described with reference to FIG. 1.

A power conversion device 10 shown in FIG. 1 is mounted on, for example, a hybrid vehicle (HV). The power conversion device 10 converts a DC power of a battery 2 (high-voltage battery) into an AC power suitable for driving motors MG1 and MG2. The power conversion device 10 converts the AC power generated by the motors MG1 and MG2 into a DC power capable of charging the battery 2.

The motor MG1 functions as a driving source of the hybrid vehicle together with an engine (not shown). In other words, the motor MG1 mainly functions as an electric motor. The motor MG1 functions as a generator during deceleration or braking, for example. The motor MG2 mainly functions as a generator. The motor MG2 functions as an electric motor by being supplied with the AC power, for example, when the engine is started. As described above, the power conversion device 10 is capable of bidirectional power conversion.

The power conversion device 10 includes a boost converter 11 and inverters 12 and 13. An input terminal of the boost converter 11 is connected to a low voltage system power line 3 on the battery 2 side, and an output terminal of the boost converter 11 is connected to a high voltage system power line 4 on the inverters 12 and 13 side. The low voltage system power line 3 is a power line that electrically connects the battery 2 and the boost converter 11, and the high voltage system power line 4 is a power line that electrically connects the boost converter 11 and the inverters 12 and 13.

A smoothing capacitor 5 is connected between a high potential side (positive electrode side) and a low potential side (negative electrode side) of the low voltage system power line 3. A smoothing capacitor 6 is connected between a high potential side (positive electrode side) and a low potential side (negative electrode side) of the high voltage system power line 4. In the low voltage system power line 3, a system main relay (SMR) (not shown) is provided between a connection point to the capacitor 5 and the battery 2.

The boost converter 11 boosts an output voltage of the battery 2 to a voltage suitable for driving the motor. In other words, the boost converter 11 boosts the electric power of the low voltage system power line 3 and supplies the boosted electric power to the high voltage system power line 4. The boost converter 11 steps down the DC power converted by the inverters 12 and 13 to an electric power that can be charged in the battery 2. In other words, the boost converter 11 steps down the electric power of the high voltage system power line 4 and supplies the step-down electric power to the low voltage system power line 3. The output voltage of the battery 2 is, for example, about 300 volts, and the output of the boost converter 11 is, for example, about 600 volts.

The boost converter 11 according to the present embodiment includes a reactor L, two switching elements T11 and T12, and two diodes D11 and D12. The switching elements T11 and T12 are connected in series between the high potential side and the low potential side of the high voltage system power line 4 with the switching element T11 as the high potential side. As the switching elements T11 and T12, an IGBT, a power MOSFET, or the like can be employed. In the present embodiment, an n-channel IGBT is employed.

The diodes D11 and D12 are connected in anti-parallel to the respective switching elements T11 and T12. Anodes of the diodes D11 and D12 are connected to emitter electrodes of the respective switching elements T11 and T12.

One end of the reactor L is connected to a terminal on the high potential side of the low voltage system power line 3, that is, on the positive electrode side of the capacitor 5. The other end of the reactor L is connected to a connection point between the switching elements T11 and T12.

The inverters 12 and 13 convert the input DC power into a three-phase AC of a predetermined frequency, and output the three-phase AC power to the respective motors MG1 and MG2. The inverters 12 and 13 convert the electric powers (AC powers) generated by the respective motors MG1 and MG2 into the DC powers. The electric power generated by the motor MG2 is selectively used according to a traveling state of the hybrid vehicle and an SOC (State Of Charge) of the battery 2.

For example, during a normal traveling, the electric power generated by the motor MG2 becomes the electric power for driving the motor MG1 as it is. On the other hand, when the SOC of the battery 2 is lower than a predetermined value, the electric power generated by the motor MG2 is converted from alternating current to direct current by the inverter 13, and then the voltage is adjusted by the boost converter 11 and stored in the battery 2. The electric power generated by the motor MG1 is converted from alternating current to direct current by the inverter 12, and thereafter the voltage is adjusted by the boost converter 11 and stored in the battery 2.

The inverter 12 is connected to the high voltage system power line 4. The inverter 12 has six switching elements T21 to T26 and six diodes D21 to D26. The switching elements T21 and T22 are connected in series between the high potential side and the low potential side of the high voltage system power line 4 with the switching element T21 as the high potential side, and configure U-phase upper and lower arms. A connection point between the switching elements T21 and T22 is electrically connected to a U-phase coil (not shown) of the motor MG1. The switching elements T23 and T24 are connected in series between the high potential side and the low potential side of the high voltage system power line 4 with the switching element T23 as the high potential side, and configure V-phase upper and lower arms. A connection point between the switching elements T23 and T24 is electrically connected to a V-phase coil (not shown) of the motor MG1. The switching elements T25 and T26 are connected in series between the high potential side and the low potential side of the high voltage system power line 4 with the switching element T25 as the high potential side, and configure W-phase upper and lower arms. A connection point between the switching elements T25 and T26 is electrically connected to a W-phase coil (not shown) of the motor MG1.

As the switching elements T21 to T26, an IGBT, a power MOSFET, or the like can be employed. In the present embodiment, an n-channel IGBT is employed. The diodes D21 to D26 are connected in anti-parallel to the respective switching elements T21 to T26. The anodes of the diodes D21 to D26 are connected to the emitter electrodes of the respective switching elements T21 to T26.

The inverter 13 has the same configuration as that of the inverter 12. The inverter 13 has six switching elements T31 to T36 and six diodes D31 to D36 connected in anti-parallel to the respective switching elements T31 to T36. The switching elements T31 and T32 are connected in series between the high potential side and the low potential side of the high voltage system power line 4 with the switching element T31 as the high potential side, and a connection point between the switching elements T31 and T32 is electrically connected to a U-phase coil (not shown) of the motor MG2. The switching elements T33 and T34 are connected in series between the high potential side and the low potential side of the high voltage system power line 4 with the switching element T33 as the high potential side, and a connection point between the switching elements T33 and T34 is electrically connected to a V-phase coil (not shown) of the motor MG2.

The switching elements T35 and T36 are connected in series between the high potential side and the low potential side of the high voltage system power line 4 with the switching element T35 as the high potential side, and a connection point between the switching elements T35 and T36 is electrically connected to a W-phase coil (not shown) of the motor MG2.

The power conversion device 10 further includes a plurality of magnetoelectric conversion elements 14. The magnetoelectric conversion element 14 is provided to detect currents flowing through the connection line 11a of the boost converter 11 and the connection lines 12a and 13a of the inverters 12 and 13. The connection line 11a electrically connects the reactor L and a connection point between the switching elements T11 and T12. The connection line 12a is a connection line for connecting a connection point of the upper and lower arms for each phase of the inverter 12 to the coil of the corresponding phase of the motor MG1. The connection line 13a is a connection line for connecting a connection point of the upper and lower arms for each phase of the inverter 13 to the coil of the corresponding phase of the motor MG2.

Next, schematic configurations of the semiconductor devices configuring the power conversion device 10 described above and a current sensor device will be described with reference to FIGS. 2 to 5. U, V, and W in FIGS. 2 and 3 indicate phases of a three-phase inverter. In FIG. 3, the main terminals 23 and 24 are omitted for convenience in order to clarify a positional relationship between the main terminal 25 and the bus bar 31 (notch 313).

Figure 2:
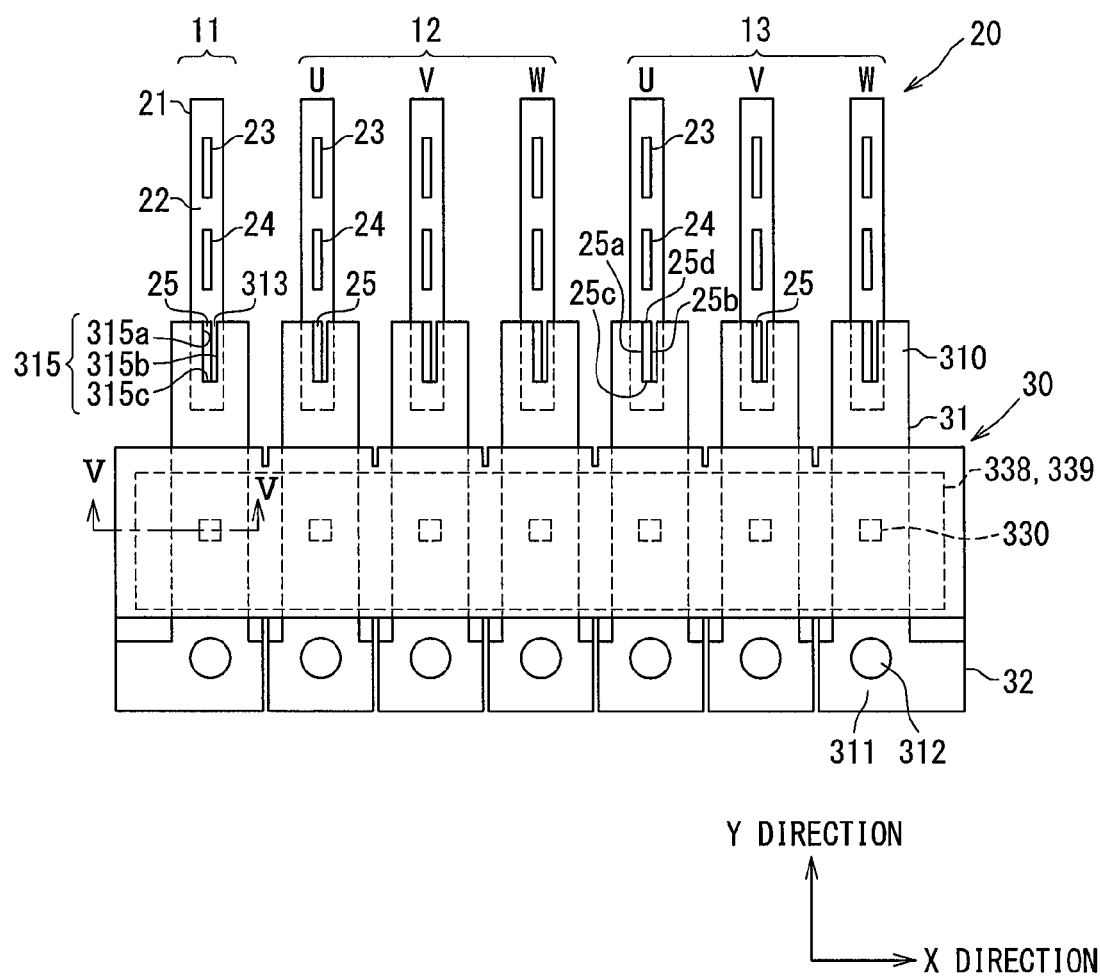
FIG. 2 is a plan view of a connection structure of a semiconductor device and the current sensor device as viewed in a Z-direction.
Figure 3:
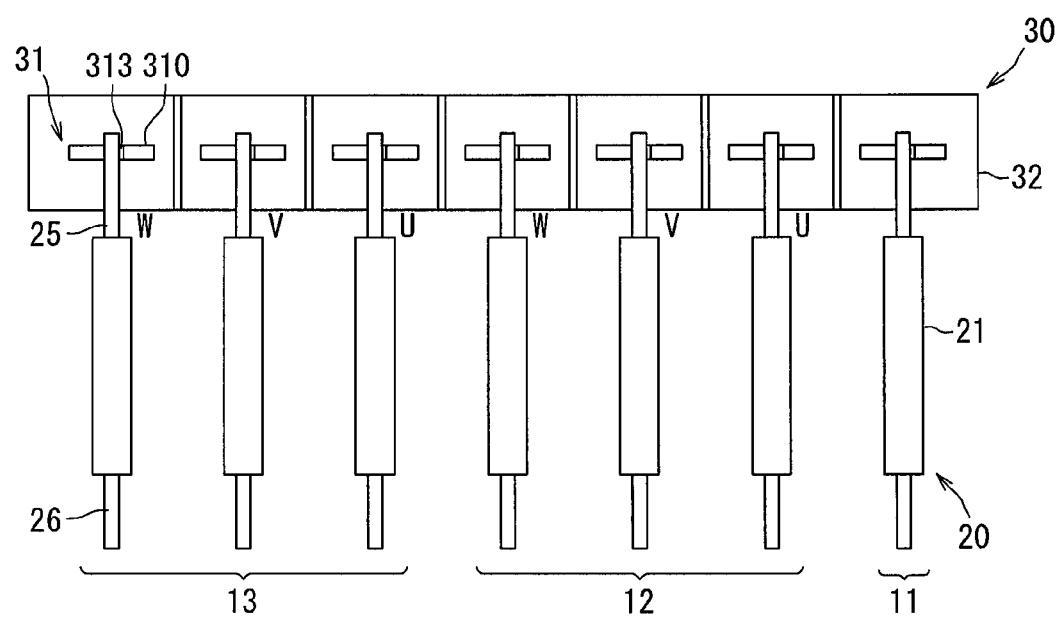
FIG. 3 is a plan view of the connection structure of the semiconductor device and the current sensor device as viewed in a Y-direction.
Figure 3:
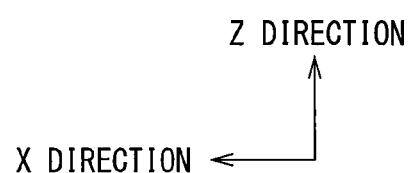

The semiconductor module 20 shown in FIGS. 2 and 3 configures the boost converter 11 and the inverters 12 and 13 described above. The semiconductor module 20 includes seven semiconductor devices 21, and upper and lower arms are formed in each of the semiconductor devices 21. The boost converter 11 is provided by one semiconductor device 21. Each of the inverters 12 and 13 is provided by three semiconductor devices 21. The seven semiconductor devices 21 are disposed side by side at a predetermined pitch (interval) in the X-direction. The semiconductor device 21 is also referred to as a power card.

The semiconductor module 20 includes a plurality of coolers (not shown) in addition to the plurality of semiconductor devices 21. The coolers and the semiconductor device 21 are alternately stacked on each other in the X-direction to form the semiconductor module 20. A detailed structure of the semiconductor module 20 in which the semiconductor devices 21 of a double-sided heat radiation structure are stacked on each other together with the coolers can incorporate a configuration disclosed in an earlier application by the present applicant (for example, Japanese Unexamined Japanese Patent Application Publication No. 2012-212776).

The semiconductor device 21 configuring the boost converter 11 includes the switching elements T11 and T12 and the diodes D11 and D12. The U-phase semiconductor device 21 configuring the inverter 12 has the switching elements T21 and T22 and the diodes D21 and D22. The V-phase semiconductor device 21 configuring the inverter 12 has the switching elements T23 and T24 and the diodes D23 and D24. The W-phase semiconductor device 21 configuring the inverter 12 has the switching elements T25 and T26 and the diodes D25 and D26.

The U-phase semiconductor device 21 configuring the inverter 13 has the switching elements T31 and T32 and the diodes D31 and D32, and the V-phase semiconductor device 21 configuring the inverter 13 has the switching elements T33 and T34 and the diodes D33 and D34. The W-phase semiconductor device 21 configuring the inverter 12 has the switching elements T35 and T36 and the diodes D35 and D36. In the present embodiment, in the respective semiconductor devices 21, the corresponding switching elements and diodes are formed in the same semiconductor chips as that of the RC IGBT.

Each semiconductor device 21 has a well-known double-sided heat radiation structure. For example, in the case of the U-phase semiconductor device 21 configuring the inverter 12, a semiconductor chip on which the switching element T21 and the diode D21 are formed, and a semiconductor chip on which the switching element T22 and the diode D 22 are formed are disposed side by side in the Y-direction with the plate thickness direction of the chip being the X-direction. A heat sink is disposed on both sides of each semiconductor chip in the X-direction, and the heat sink is electrically and thermally connected to the corresponding semiconductor chip. The semiconductor chip and the heat sink are sealed with a molded resin 22. Though not shown, a surface of each heat sink on the opposite side to the semiconductor chip is exposed from the molded resin 22. The semiconductor device 21 other than the U-phase semiconductor device 21 configuring the inverter 13 has the same configuration.

The semiconductor device 21 has main terminals 23 to 25 and a signal terminal 26 as terminals for external connection. For example, in the case of the U-phase semiconductor device 21 configuring the inverter 12, the main terminal 23 is electrically connected to a collector electrode of the switching element T21 through a heat sink. Since the main terminal 23 is connected to the high potential side (positive electrode side) of the high voltage system power line 4, the main terminal 23 is also referred to as a high potential power supply terminal and a P terminal.

The main terminal 24 is electrically connected to the emitter electrode of the switching element T22 through a heat sink. Since the main terminal 24 is connected to the low potential side (the negative electrode side) of the high voltage system power line 4, the main terminal 24 is also referred to as a low potential power supply terminal or an N terminal. The main terminal 25 is electrically connected to a connection point between the switching elements T21 and T22 through the heat sink. The main terminal 25 configures a part of the connection line 12a. The main terminal 25 is also referred to as an output terminal and an O terminal. The main terminal 25 corresponds to a terminal to which the bus bar 31 to be described later is connected.

The main terminals 23 to 25 are flat plates made of a metal material such as copper. The main terminals 23 to 25 are formed by pressing (punching) a metal plate such as copper in the thickness direction. Each of the flat plate-like main terminals 23 to 25 extends in the Z-direction with the thickness direction as the X-direction. The main terminals 23 to 25 of the same semiconductor device 21 are arrayed side by side in the Y-direction. The main terminals 23 and 24 are positioned adjacent to each other, and the main terminal 25 is disposed at one end in the Y-direction, which is an alignment direction. In the present embodiment, the main terminal 25 (O terminal), the main terminal 24 (N terminal), and the main terminal 23 (P terminal) are aligned in the stated order from the side of the current sensor device 30 in the Y-direction. The main terminals 23 to 25 project to the outside from the same side surface of four side surfaces of the molded resin 22 having a substantially rectangular planar shape.

The signal terminal 26 is electrically connected to a pad of the semiconductor chip on which the switching element T21 and the diode D21 are formed, and a pad of the semiconductor chip on which the switching element T22 and the diode D22 are formed through a bonding wire (not shown) or the like. The signal terminal 26 extends in the Y-direction, and protrudes to the outside from the side surface of the molded resin 22 opposite to the side surface from which the main terminals 23 to 25 protrude. The semiconductor device 21 other than the U-phase semiconductor device 21 configuring the inverter 13 has the same configuration.

In the seven semiconductor devices 21 aligned side by side in the X-direction, the main terminals 23, the main terminals 24, and the main terminals 25 are respectively aligned side by side in the X-direction. In other words, in a projection view in the X-direction, the main terminals 23 overlap with each other, the main terminals 24 overlap with each other, and the main terminals 25 overlap with each other.

As shown in FIGS. 2 to 5, the current sensor device 30 includes a bus bar 31, a resin portion 32, and a current sensor 33. The current sensor device 30 is the current sensor 33 with the bus bar 31. The current sensor device 30 is a bus bar unit including the current sensor 33. The current sensor device 30 is provided for the boost converter 11 and the inverters 12 and 13.

The bus bar 31 is formed of a conductive member to function as an electrically conductive path. The bus bar 31 is formed by pressing (punching) a metal plate such as copper in the plate thickness direction. In the present embodiment, the plate thicknesses are substantially equal in the entire length of the bus bar 31. One bus bar 31 is provided for each main terminal 24. The current sensor device 30 has seven bus bars 31. More specifically, there are one bus bar 31 corresponding to the boost converter 11, three bus bars 31 corresponding to each phase of the inverter 12, and three bus bars corresponding to each phase of the inverter 13.

In the boost converter 11, the bus bar 31 electrically relays a connection point between the switching elements T11 and T12 and the reactor L. In other words, the bus bar 31 configures a part of the connection line 11a. In the inverter 12, for example, the U-phase bus bar 31 electrically relays a connection point between the switching elements T21 and T22 and a U-phase coil of the motor MG1. In other words, the U-phase bus bar 31 configures a part of the connection line 12a. In the inverter 13, for example, the U-phase bus bar 31 electrically relays a connection point between the switching elements T31 and T32 and a U-phase coil of the motor MG2. In other words, the U-phase bus bar 31 configures a part of the connection line 13a.

In the present embodiment, each of the bus bars 31 has the same plate thickness direction (Z-direction) over the entire length in the extension direction from the one end 310 to the other end 311 opposite to the one end 310. In other words, there is no bent portion in the plate thickness direction between the one end 310 and the other end 311.

Figure 4:
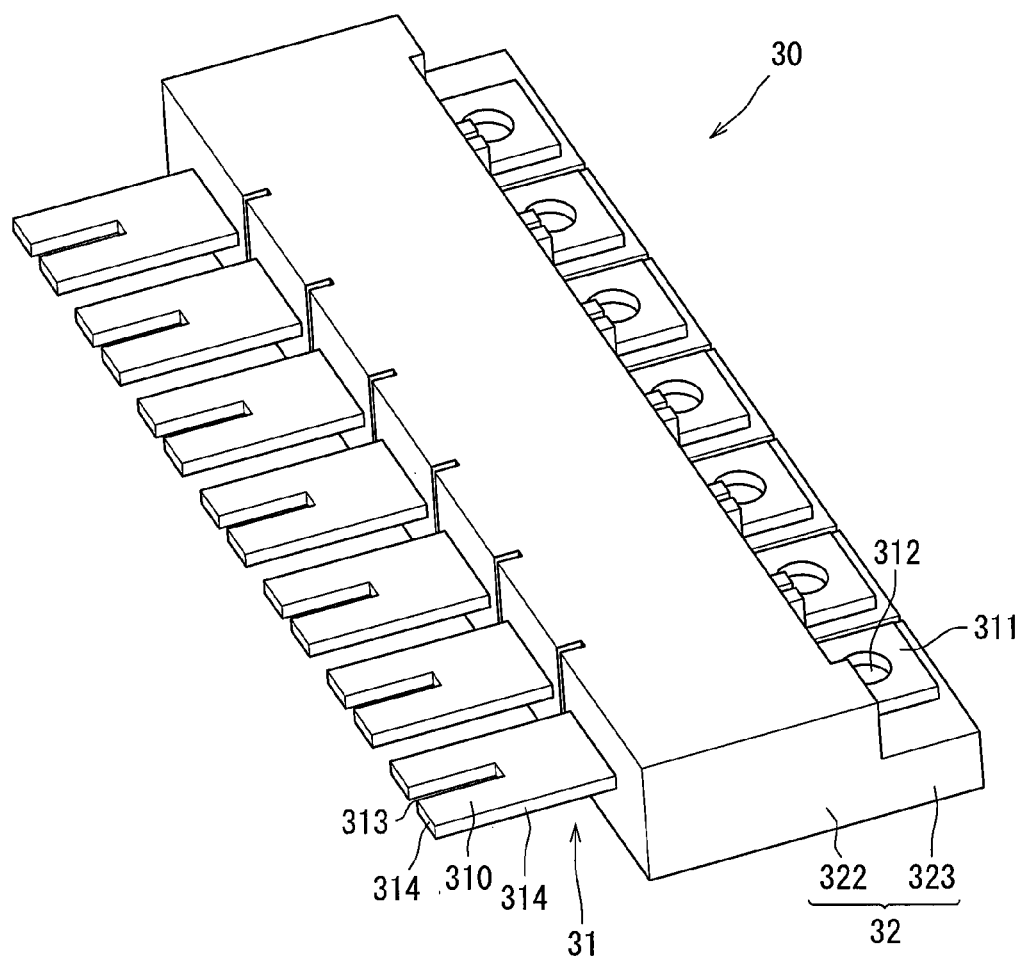
FIG. 4 is a perspective view showing the current sensor device.
Figure 4:
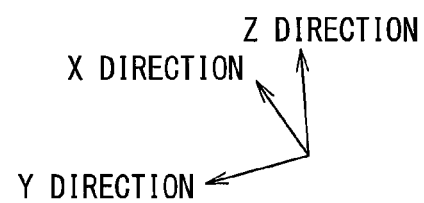

More specifically, each bus bar 31 extends in the Y-direction, and an intermediate portion in the extension direction is covered with the resin portion 32. One end 310 and the other end 311 are exposed from the resin portion 32. The main terminal 25 is connected to one end 310 of the bus bar 31. The terminals of the corresponding motors MG1 and MG2 and the connection line on the reactor L side are connected to the other end 311. For that purpose, as shown in FIGS. 2 and 4, a through hole 312 is provided in the other end 311. The one end 310 and the other end 311 respectively indicate not only an end portion (edge portion) of the bus bar 31 but also a predetermined region including an edge portion. One end 310 indicates a region on one end side including one end, and the other end 311 indicates an area on the other end side including the other end.

The resin portion 32 integrally holds the bus bar 31 and the current sensor 33 (the magnetoelectric conversion element 14). According to the present embodiment, the resin portion 32 integrally holds the multiple bus bars 31 and the current sensors (magnetoelectric conversion elements 14) corresponding to the boost converter 11 and the inverters 12 and 13. The resin portion 32 holds the bus bars 31 so that the multiple bus bars 31 are aligned side by side at a predetermined pitch in the X-direction, which is a width direction, while the plate thickness direction is the Z-direction.

Figure 5:
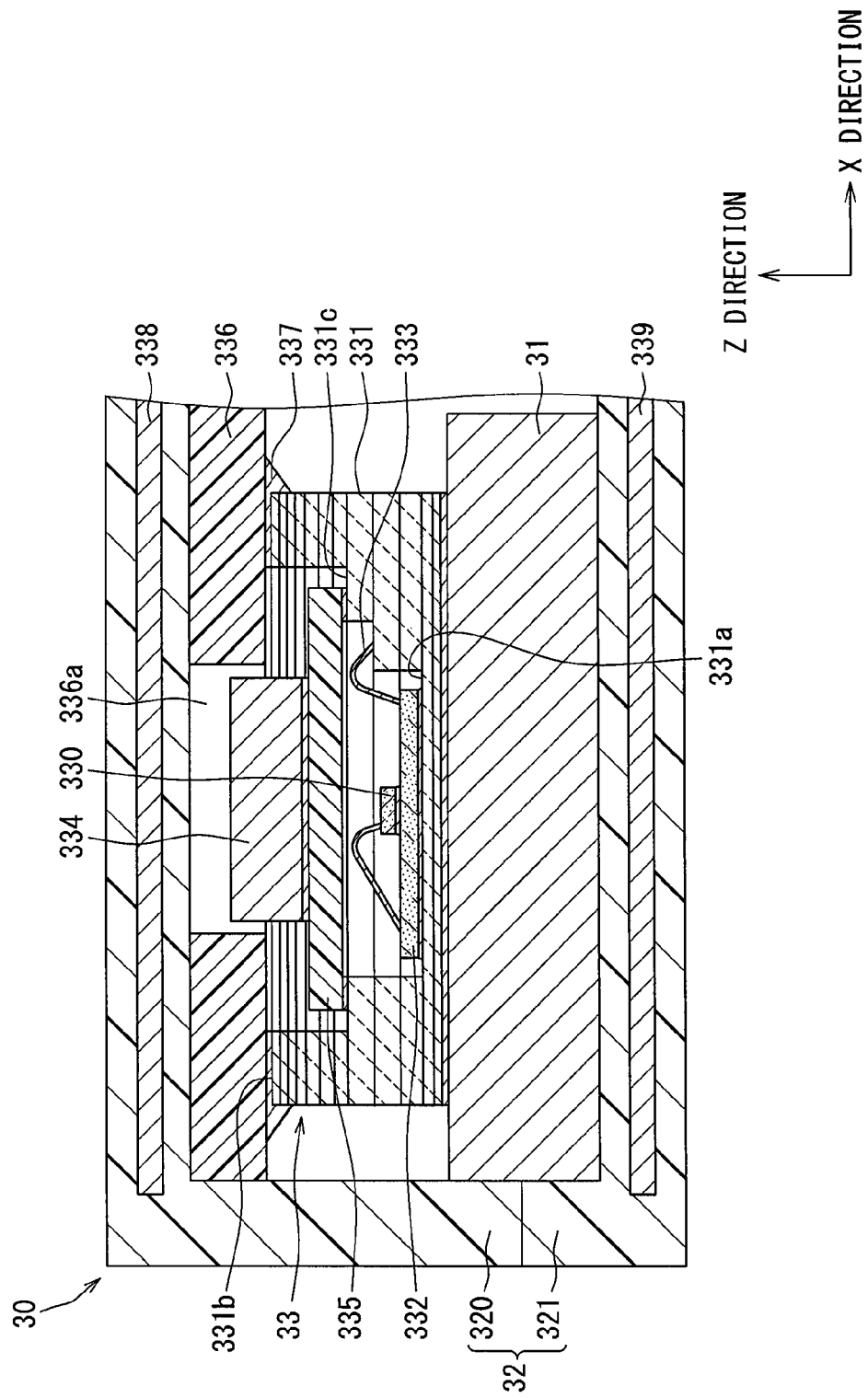
FIG. 5 is a cross-sectional view taken along a line V-V of FIG. 2.

In the present embodiment, the resin portion 32 has cases 320 and 321 as shown in FIG. 5. In other words, the resin portion 32 has a two-divided structure in the Z-direction. The magnetoelectric conversion element 14 and the like are disposed in an internal space of the resin portion 32 (that is, the housing) which is formed in a state in which the cases 320 and 321 are assembled. As the resin portion 32, for example, a molded resin may be employed.

As shown in FIG. 4, the resin portion 32 has an accommodation portion 322 and a support portion 323. The accommodation portion 322 accommodates the magnetoelectric conversion element 14 and the like configuring the current sensor 33. The accommodation portion 322 is formed of the cases 320 and 321. The support portion 323 is formed of the case 321.

The other end 311 of each bus bar 31 is supported by the support portion 323. In other words, the other end 311 is disposed on the surface of the support portion 323. The support portion 323 is formed with recess portions corresponding to the through holes 312 provided in the other ends 311. The recess portion may be replaced with a through hole. The other end 311 of each bus bar 31 is electrically connected to the terminals of the corresponding motors MG1 and MG2 and the connection line on the reactor L side by fastening or the like. On the other hand, one end 310 of each bus bar 31 protrudes from the resin portion 32.

The current sensor 33 detects a current flowing through the corresponding bus bar 31, and outputs a detection signal to a control circuit that controls driving of the switching elements T11, T12, T21 to T26, and T31 to T36. The current sensor 33 has a sensor chip 330 on which the magnetoelectric conversion element 14 is formed. As shown in FIG. 5, the current sensor 33 according to the present embodiment further includes a ceramic package 331, a processing circuit chip 332, bonding wires 333, a bias magnet 334, a spacer 335, a circuit board 336, a solder 337, and magnetic shields 338 and 339. In this way, the current sensor 33 is a coreless current sensor that does not require a core.

The magnetoelectric conversion element 14 corresponding to the inverter 12 is formed on the sensor chip 330. The magnetoelectric conversion element 14 detects a magnetic flux density of a magnetic field generated when a current flows through the corresponding bus bar 31, and converts the detected magnetic flux density into an electric signal. The sensor chip 330 (magnetoelectric conversion element 14) is disposed on the bus bar 31 in the Z-direction, which is the plate thickness direction of the bus bar 31. The magnetoelectric conversion element 14 can be formed of a giant magnetoresistance effect element (GMR), an anisotropic magnetoresistance effect element (AMR), a tunneling magnetoresistance effect element (TMR), a Hall element, or the like. According to the present embodiment, the magnetoelectric conversion element 14 whose electric signal changes according to the direction of a magnetic vector such as the GMR or the TMR is formed on the sensor chip 330.

The ceramic package 331 is a container that provides a space for accommodating the sensor chip 330. The ceramic package 331 is formed by stacking a plurality of ceramic plates on each other. The ceramic package 331 has a side wall portion provided in an annular shape and a bottom portion for closing one of the openings of the side wall portion. A wiring (not shown) is formed in the ceramic package 331. The ceramic package 331 is fixed to the bus bar 31 on a surface of the bottom portion opposite to an inner surface 331a (hereinafter referred to as bottom inner surface 331a). The ceramic package 331 is disposed on the bus bar 31 in the Z-direction.

The processing circuit chip 332 performs predetermined calculation processing with the use of a signal input from the sensor chip 330, and outputs the calculation result to the circuit board 336. The processing circuit chip 332 is also disposed in an accommodation space of the ceramic package. A sensor chip 330 is mounted on the processing circuit chip 332 through an adhesive or the like. The processing circuit chip 332 is fixed to the bottom inner surface 331a of the ceramic package 331. The sensor chip 330 is fixed to the bottom inner surface 331a through the processing circuit chip 332.

The sensor chip 330 is electrically connected to the processing circuit chip 332 through the bonding wires 333. The processing circuit chip 332 is electrically connected to the wiring of the ceramic package 331 through the bonding wires 333.

The bias magnet 334 applies a magnetic vector which is a reference of an electric signal to the sensor chip 330. The bias magnet 334 may be a permanent magnet or an electromagnet. The bias magnet 334 is disposed on a side of the sensor chip 330 opposite to the bus bar 31 so as to overlap with the sensor chip 330 (magnetoelectric conversion element 14) in a projection view from the Z-direction. In other words, the sensor chip 330 is positioned between the bias magnet 334 and the bus bar 31 in the Z-direction. In the present embodiment, in the Z-direction, a part of the bias magnet 334 is disposed in the accommodation space of the ceramic package 331, and the remaining part protrudes from the accommodation space to the outside.

The bias magnet 334 is fixed to the spacer 335 through an adhesive or the like. The spacer 335 is positioned between the sensor chip 330 and the bias magnet 334 in the Z-direction. The spacer 335 is a member for ensuring a predetermined distance between the sensor chip 330 and the bias magnet 334. The spacer 335 is made of a resin material, for example. The ceramic package 331 has a step 331c provided between the bottom inner surface 331a and an upper opening end 331b in the Z-direction on the accommodation space side. The step 331c has an annular shape. The spacer 335 is fixed to the step 331c through an adhesive or the like.

The circuit board 336 is electrically connected to the processing circuit chip 332 through the bonding wires 333 and the wiring of the ceramic package 331. The wiring (not shown) of the circuit board 336 is electrically connected to the wiring of the ceramic package 331 through the solder 337. The circuit board 336 is shared by the plurality of bus bars 31, in other words, the plurality of current sensors 33. The circuit board 336 is disposed so as to extend across the plurality of bus bars 31 in the X-direction. The circuit board 336 is disposed on the upper open end 331b of the ceramic package 331. The circuit board 336 is disposed so as to close an upper opening of the ceramic package 331.

A through hole 336a is provided in the circuit board 336, and a part of the bias magnet 334 is disposed in the through hole 336a. The through-hole 336a can be replaced with a recess portion (non-through hole) that opens only on the surface of the circuit board 336 on the sensor chip 330 side.

The magnetic shields 338 and 339 are made of a magnetic material. The magnetic shields 338 and 339 prevent transmission of an external magnetic field to the current sensor device 30 through the magnetoelectric conversion element 14. In other words, the magnetic shields 338 and 339 shield the external magnetic field from the magnetoelectric conversion element 14. The magnetic shields 338 and 339 are shared by the magnetoelectric conversion elements 14 (sensor chips 330) disposed in the respective bus bars 31. Like the circuit board 336, the magnetic shields 338 and 339 are shared by the plurality of bus bars 31. As shown in FIG. 2, the magnetic shields 338 and 339 are disposed so as to extend across the plurality of bus bars 31 in the X-direction.

As shown in FIG. 5, the magnetic shields 338 and 339 are plate-like members. The magnetic shields 338 and 339 are disposed so that the plate thickness direction is the Z-direction. The magnetic shields 338 and 339 are opposed to each other across a space in the Z-direction. The magnetic shields 338 and 339 face each other in the Z-direction so as to sandwich the bus bar 31, sensor chip 330 (magnetoelectric conversion element 14), and the bias magnet 334 between the magnetic shields 338 and 339.

As described above, the bus bar 31, the sensor chip 330 (magnetoelectric conversion element 14) configuring the current sensor 33, the ceramic package 331, the processing circuit chip 332, the bias magnet 334, and the spacer 335 are provided for each of the seven upper and lower arms configuring the power conversion device 10. On the other hand, the resin portion 32, the circuit board 336 configuring the current sensor 33, and the magnetic shields 338 and 339 are shared by the seven upper and lower arms.

Next, a connection structure of the main terminal 25 and the bus bar 31 will be described.

A projected portion of the main terminal 25 projected from the molded resin 22 has a substantially rectangular parallelepiped shape. As shown in FIG. 2, the main terminal 25 has surfaces 25a and 25b in the thickness direction (X-direction) of the main terminal 25, and has side surfaces 25c and 25d in the width direction (Y-direction) orthogonal to the extension direction (Z-direction) and the thickness direction.

As shown in FIGS. 2 to 4, the bus bar 31 has a notch 313 at one end 310. The notch 313 penetrates through the bus bar 31 in the Z-direction, which is the plate thickness direction. The bus bar 31 has surfaces including one surface in the Z-direction, which is the plate thickness direction, a back surface opposite to the one surface, and an outer peripheral surface 314 (outer surface). The notch 313 opens to the outer peripheral surface 314. The notch 313 opens to an end face of the outer peripheral surface 314 in the Y-direction, which is the extension direction. The notch 313 extends in the Y-direction, which is the width direction of the main terminal 25, while penetrating through the bus bar 31 in the Z-direction. The notch 313 corresponds to a penetration portion.

The notch 313 is defined by a wall surface 315 which is an inner surface of the bus bar 31. The wall surface 315 has a first wall surface 315a and a second wall surface 315b that face each other in the X-direction, and a third wall surface 315c that is located opposite to the opening of the notch 313 in the Y-direction and forms a bottom. In the Y-direction, one ends of the first wall surface 315a and the second wall surface 315b are connected to the outer peripheral surface 314, and the other ends are connected to the third wall surface 315c. The first wall surface 315a and the second wall surface 315b correspond to a pair of opposing wall surfaces.

The first wall surface 315a and the second wall surface 315b have portions parallel to each other. An opposing distance between the first wall surface 315a and the second wall surface 315b is set so that the main terminal 25 is accommodated in the notch 313 in consideration of a positional variation of the main terminal 25 in the thickness direction. A depth of the notch 313 is not particularly limited. In order to increase a connection area between the main terminal 25 and the bus bar 31, it is preferable that the depth is greater, and the depth is greater than or equal to the width of the main terminal 25.

According to the present embodiment, the first wall surface 315a and the second wall surface 315b are substantially parallel to each other on the entire surface. In other words, the width of the notch 313 is kept substantially constant in the depth direction (Y-direction). The first wall surface 315a and the second wall surface 315b are surfaces orthogonal to each other in the X-direction. The depth of the notch 313 is longer than the width of the main terminal 25. As shown in FIG. 2, the surface 25a of each main terminal 25 comes in contact with the first wall surface 315a of the corresponding bus bar 31. Further, the side surface 25c of each main terminal 25 is in contact with the third wall surface 315c of the corresponding bus bar 31. In the above positioning state, the main terminal 25 and the bus bar 31 are welded to each other.

Next, the effects of the current sensor device 30 according to the present embodiment, and further the power conversion device 10, will be described.

In connection between the semiconductor device and the current sensor device, it is conceivable that the main terminal may be inclined in a direction away from the bus bar in the thickness direction of the main terminal due to factors on the semiconductor device side, for example, manufacturing variations of the semiconductor devices, assembly variations of the semiconductor devices and the coolers, and the like. In other words, the position of the connection portion with the bus bar in the main terminal varies in the thickness direction. For that reason, there is a need to press the main terminal and the bus bars with the use of a positioning member such as a clamp and weld those components in that positioning state.

On the other hand, according to the present embodiment, the notch 313 as the penetration portion is defined in the bus bar 31. The first wall surface 315a and the second wall surface 315b facing each other are provided as the wall surfaces 315 defining the notch 313. Therefore, the main terminal 25 can be brought into contact with at least one of the first wall surface 315a and the second wall surface 315b even if the position of the main terminal 25, more specifically, the connection position with the bus bar 31, varies in the thickness direction of the main terminal 25 due to a factor on the side of the semiconductor device 21. In this manner, the bus bar 31 can be positioned with respect to the main terminal 25 without using a positioning member. In other words, the main terminal 25 and the bus bar 31 can be connected (welded) to each other without using a positioning member.

The wall surface 315 of the notch 313, that is, a shearing cross section of the bus bar 31 by pressing, is defined as a connection surface with the main terminal 25. Though not shown in the drawing, a burr caused by the press is likely to be generated on one surface of the bus bar 31 in the plate thickness direction, and are not generated on the shear cross section. The burr extends in the Z-direction. Therefore, even if a burr is generated in the bus bar 31, the main terminal 25 and the bus bar 31 can be connected to each other without being affected by the burr.

As described above, the current sensor device 30 according to the present embodiment is excellent in the assembling property with the plate-shaped main terminal 25 included in the semiconductor device 21.

In addition, according to the present embodiment, the plate thickness direction of the bus bar 31 is the same from one end 310 to the other end 311 of the bus bar 31. In other words, the bus bar 31 does not have a bent portion in the plate thickness direction. Therefore, a variation in the position of the one end 310 due to the bent portion can be suppressed. As a result, the assembling property with the plate-shaped main terminal 25 can be further improved.

According to the present embodiment, the notch 313 opened in the outer peripheral surface 314 of the bus bar 31 is employed as the penetration portion. For that reason, even if the position of the main terminal 25 varies in the width direction (Y-direction) of the main terminal 25, the main terminal 25 is easily brought into contact with at least one of the first wall surface 315a and the second wall surface 315b. In addition, the multiple main terminals 25 provided side by side and the corresponding bus bars 31 are easily positioned together. Further, since the main terminal 25 can be brought into contact with the third wall surface 315c, the connection area between the main terminal 25 and the bus bar 31 can be increased.

According to the present embodiment, the first wall surface 315a and the second wall surface 315b facing the surfaces 25a and 25b of the main terminal 25 have portions parallel to each other, and come in contact with the main terminal 25 at the portions parallel to each other. This also makes it possible to increase the connection area between the main terminal 25 and the bus bar 31. In particular, according to the present embodiment, the depth of the notch 313 is longer than the width of the main terminal 25, and the first wall surface 315a and the main terminal 25 come in contact with each other along the entire length of the first wall surface 315a in the Y-direction. This also makes it possible to increase the connection area between the main terminal 25 and the bus bar 31.

Second Embodiment

The present embodiment can refer to the preceding embodiment. For that reason, a description of portions common to the power conversion device 10, the semiconductor module 20 (the semiconductor device 21), and the current sensor device 30 illustrated in the preceding embodiment will be omitted.

Figure 6:
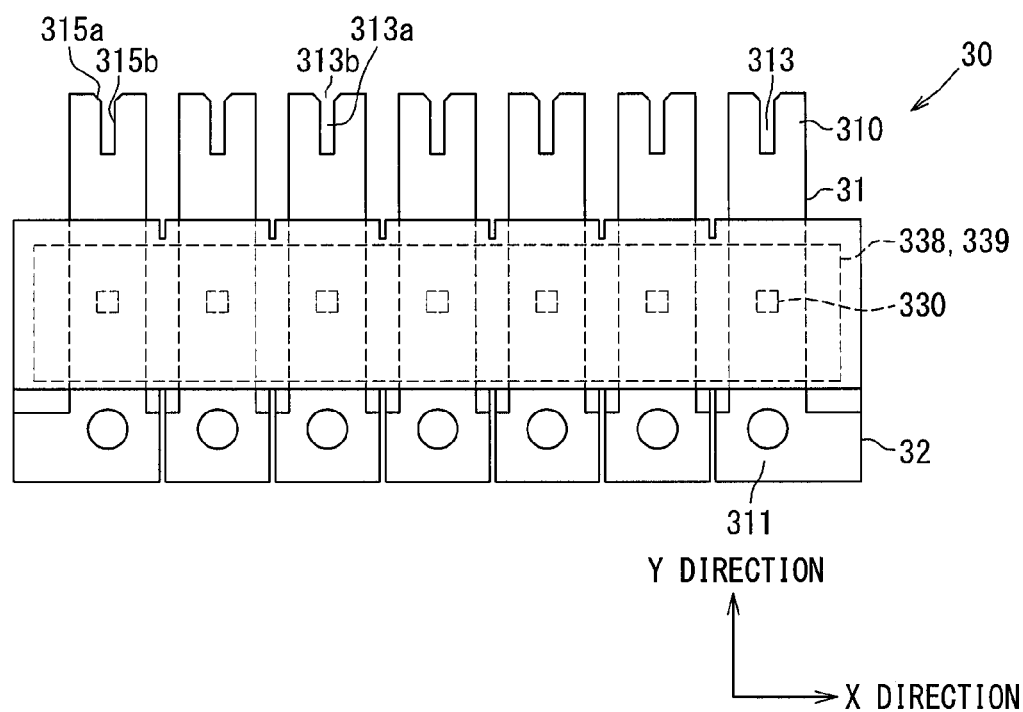
FIG. 6 is a plan view showing a current sensor device according to a second embodiment.

According to the present embodiment, as shown in FIG. 6, a notch 313 has a narrow width portion 313a in which a width between a first wall surface 315a and a second wall surface 315b is narrowed, and a wide width portion 313b in which the width is wider than the narrow width portion 313a. In other words, the notch 313 has the narrow width portion 313a in which the width between the first wall surface 315a and the second wall surface 315b is a predetermined width, and the wide width portion 313b in which the width is wider than the predetermined width of the narrow width portion 313a. In this example, the width of the notch 313 is a length in a direction (X-direction) orthogonal to the Y-direction which is the depth direction.

A main terminal 25 is connected to, for example, the first wall surface 315a at the narrow width portion 313a. The wide width portion 313b is provided at an end portion on the opening side to the outer peripheral surface 314 in the depth direction of the notch 313. The wide width portion 313b is continuous with the narrow width portion 313a on the opening side to the outer peripheral surface 314. The narrow width portion 313a is provided on a bottom side of the notch 313.

Further, according to the present embodiment, the first wall surface 315a and the second wall surface 315b of the wide width portion 313b have a tapered shape. Specifically, the first wall surface 315a and the second wall surface 315b of the wide width portion 313b are tapered so that an opposing distance between the first wall surface 315a and the second wall surface 315b is longer toward the outer peripheral surface 314 (end face in the Y-direction).

According to the above configuration, even if the position of the main terminal 25 varies in the thickness direction (X-direction) of the main terminal 25, the main terminal 25 can be guided to the bottom side of the notch 313 along the tapered portion, so that the main terminal 25 can be easily placed in the notch 313. In other words, the main terminal 25 is easily brought into contact with at least one of the first wall surface 315a and the second wall surface 315b. In particular, even if the position variation is different at the multiple main terminals 25 provided side by side, the corresponding bus bars 31 can be positioned at once.

A burr of the main terminal 25 due to pressing may occur on one surface of the main terminal 25 in the thickness direction. The burr extends in the X-direction, which is the thickness direction. According to the present embodiment, the notch 313 has the narrow width portion 313a and the wide width portion 313b, and the main terminal 25 comes in contact with at least one of the first wall surface 315a and the second wall surface 315b in the narrow width portion 313a. Even if the main terminal 25 has a burr by pressing at the end portion on the opening side of the notch 313, the burr is accommodated in the wide width portion 313b and comes out of contact with the wall surface 315. Therefore, the main terminal 25 and the bus bar 31 can be connected to each other without being affected by the burr of the main terminal 25. In other words, the assembling property of the main terminal 25 and the bus bar 31 can be further improved.

According to the present embodiment, the first wall surface 315a and the second wall surface 315b both have the tapered shape in the wide width portion 313b, but the present disclosure is not limited to the above configuration. In the wide width portion 313b, at least one of the first wall surface 315a and the second wall surface 315b may have a tapered shape such that the opposing distance between the first wall surface 315a and the second wall surface 315b is longer toward the outer peripheral surface 314 (end face in the Y-direction). For example, only the first wall surface 315a may have a tapered portion, and the entire surface of the second wall surface 315b may be a surface substantially orthogonal to the X-direction. Further, in the wide width portion 313b, only a predetermined range from the outer peripheral surface 314 may be tapered, and a portion on the bottom side of the notch 313 may have a constant width.

Third Embodiment

The present embodiment can refer to the preceding embodiment. For that reason, a description of portions common to the power conversion device 10, the semiconductor module 20 (the semiconductor device 21), and the current sensor device 30 illustrated in the preceding embodiment will be omitted.

Figure 7:
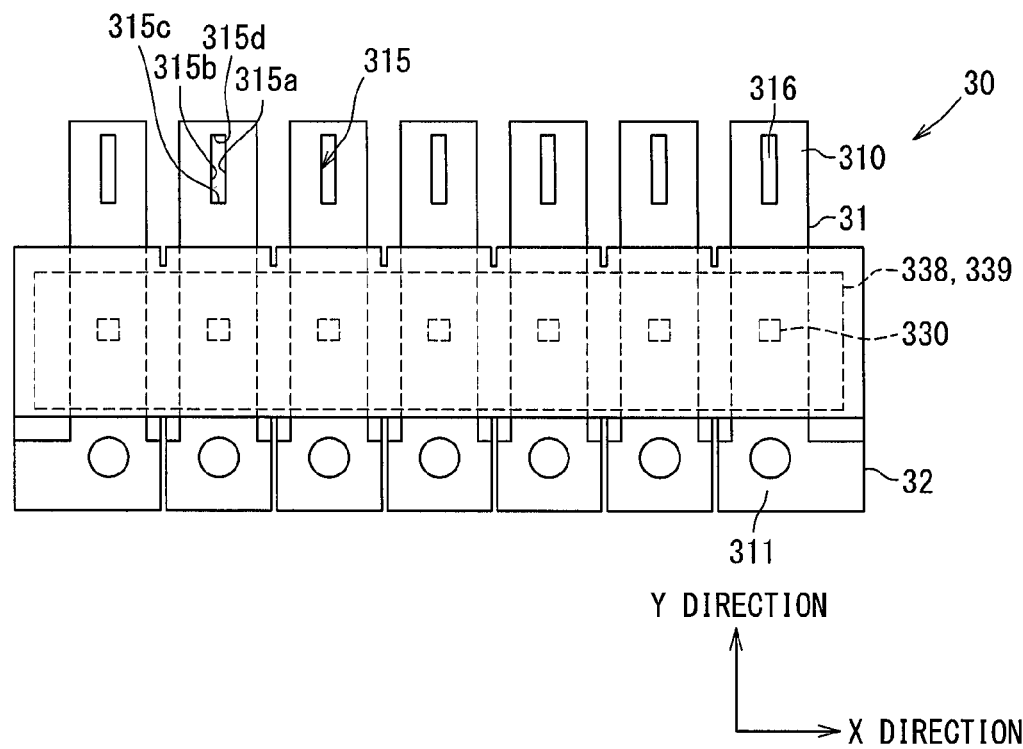
FIG. 7 is a plan view showing a current sensor device according to a third embodiment.

According to the present embodiment, as shown in FIG. 7, each bus bar 31 has a through hole 316 as a penetration portion. The through hole 316 is not opened to the outer peripheral surface 314, and is surrounded by the wall surface 315 to provide a closed space.

A shape of the through hole 316 along an XY-plane has a substantially rectangular shape in a plan view corresponding to the main terminal 25. The bus bar 31 has a fourth wall surface 315d in addition to a first wall surface 315a, a second wall surface 315b, and a third wall surface 315c described above, as the wall surface 315. The third wall surface 315c and the fourth wall surface 315d face each other in the Y-direction which is the width direction of the main terminal 25. The opposing distance between the third wall surface 315c and the fourth wall surface 315d is slightly longer than the width of the main terminal 25.

According to the above configuration, the main terminal 25 is inserted into the through hole 316 and welded in this state. Even if the position of the main terminal 25 varies in the width direction (Y-direction), since the third wall surface 315c and the fourth wall surface 315d are present on both sides in the width direction, the contact area is easily secured also in the width direction.

A portion of the wall surface 315 in the vicinity of the opening on the semiconductor device 21 side in the Z-direction may be tapered. This makes it easier to insert the main terminal 25 into the through hole 316.

Fourth Embodiment

The present embodiment can refer to the preceding embodiment. For that reason, a description of portions common to the power conversion device 10, the semiconductor module 20 (the semiconductor device 21), and the current sensor device 30 illustrated in the preceding embodiment will be omitted.

Figure 8:
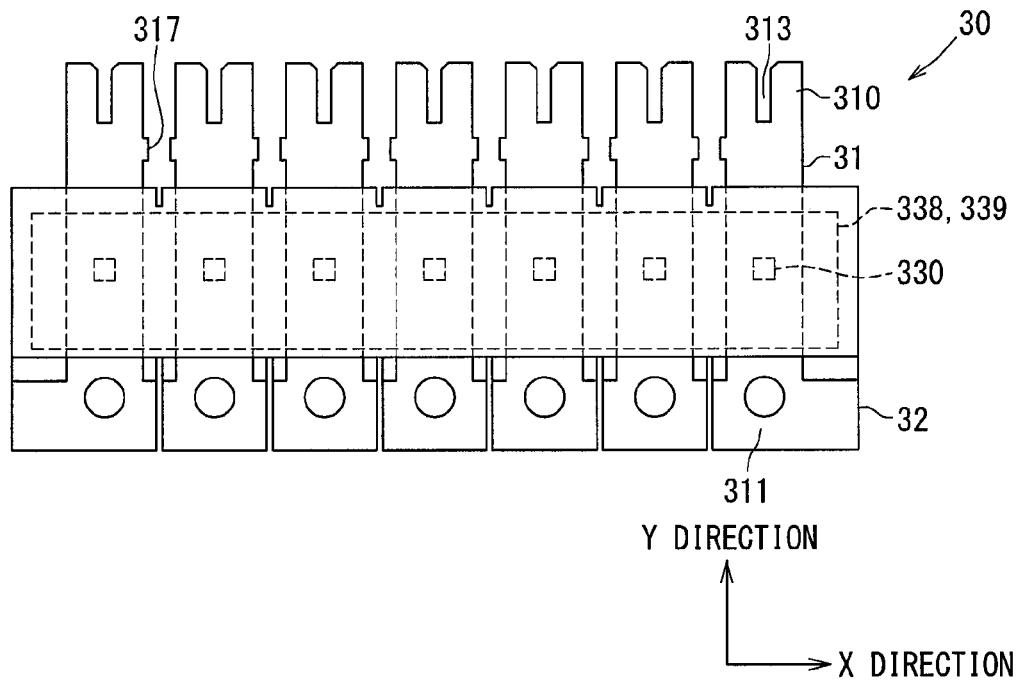
FIG. 8 is a plan view showing a current sensor device according to a fourth embodiment.

According to the present embodiment, as shown in FIG. 8, each bus bar 31 has a cutting mark 317 on a surface of the outer peripheral surface 314 adjacent to the adjacent bus bar 31, that is, on a surface facing the adjacent bus bar 31. Specifically, in the X-direction, the bus bars 31 located at both ends have the cutting marks 317 only on the inner surface in the X-direction, and the other bus bars 31 have the cutting marks 317 on both surfaces in the X-direction. The cutting mark 317 is a mark obtained by cutting a tie bar 318, which will be described later. According to the present embodiment, the cutting mark 317 protrudes in the X-direction from the other portion of the surface on which the cutting mark 317 is provided. The other configuration is the same as that of the second embodiment shown in FIG. 6.

Figure 9:
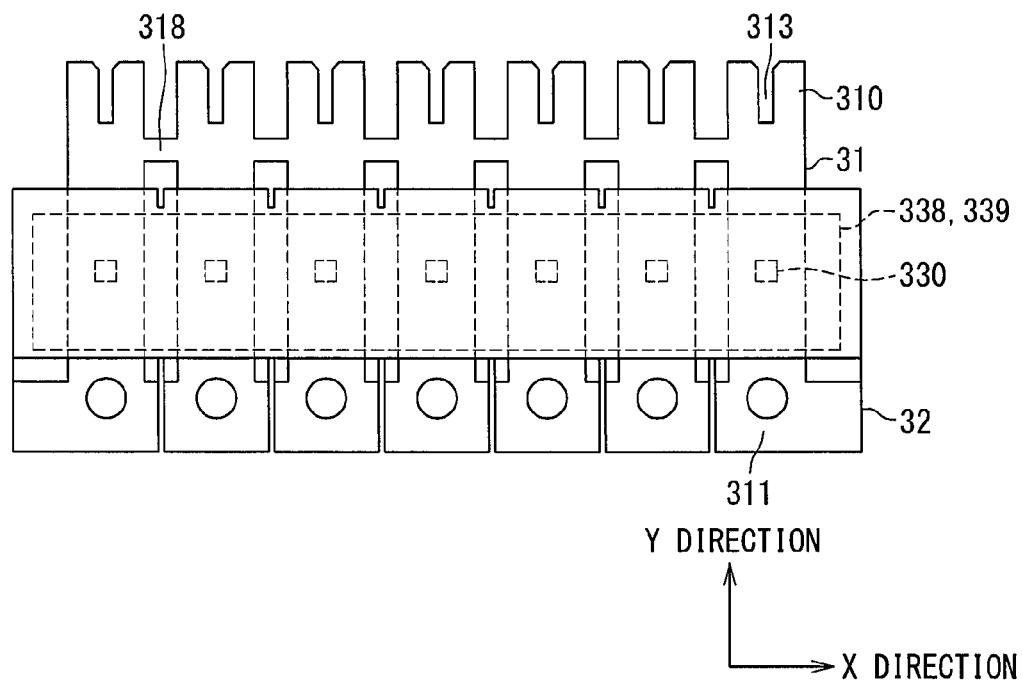
FIG. 9 is a plan view showing a process of manufacturing the current sensor device.

FIG. 9 shows a state before cutting the tie bar 318. The plurality of bus bars 31 are connected to each other by the tie bars 318. The plurality of bus bars 31 are configured as a part of a lead frame. The current sensor device 30 shown in FIG. 8 can be obtained by cutting the tie bars 318 after the bus bars 31 have been placed in the resin portion 32.

According to the above configuration, the plurality of bus bars 31 are positioned with respect to the common resin portion 32 in the state of the lead frame connected by the tie bars 318. Therefore, the accuracy of the positions of the bus bars 31 can be improved. For that reason, the multiple main terminals 25 provided side by side and the corresponding bus bars 31 are easily positioned in a lump.

Fifth Embodiment

The present embodiment can refer to the preceding embodiment. For that reason, a description of portions common to the power conversion device 10, the semiconductor module 20 (the semiconductor device 21), and the current sensor device 30 illustrated in the preceding embodiment will be omitted.

Figure 10:
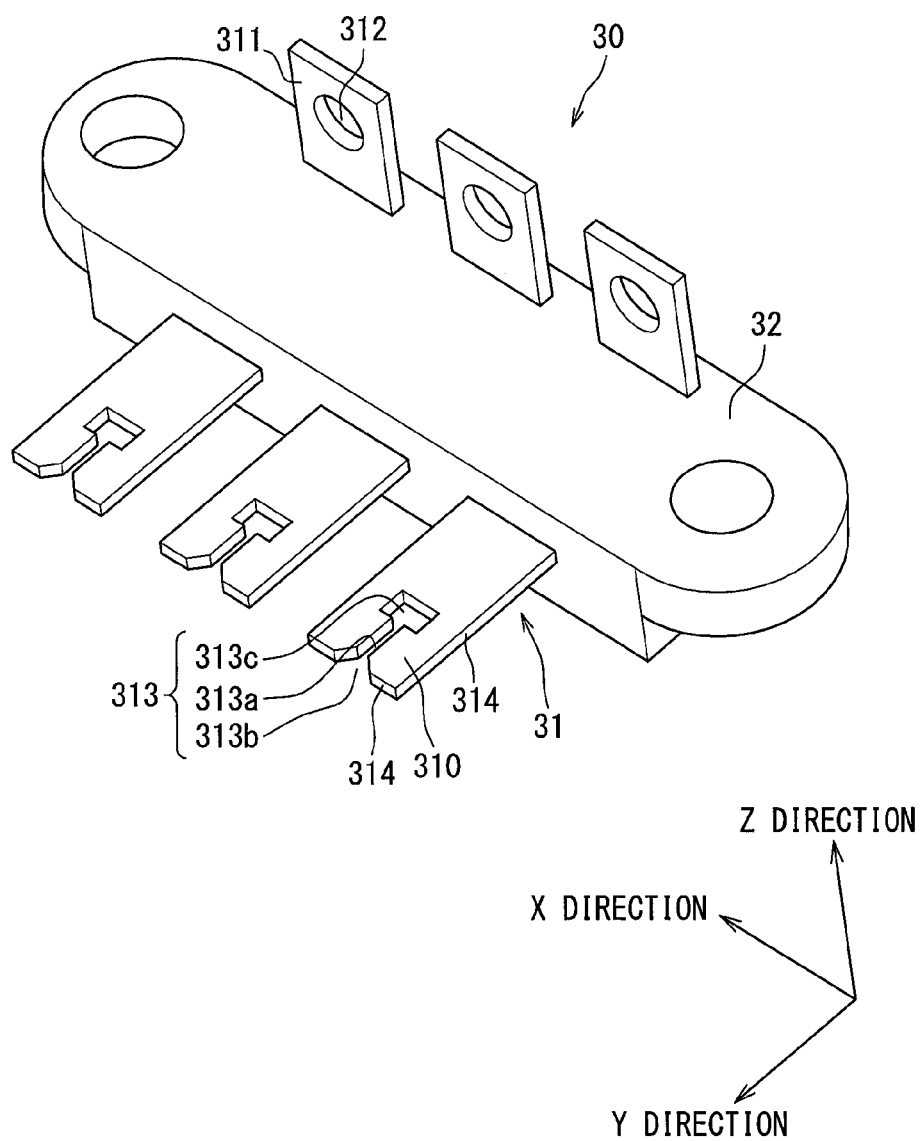
FIG. 10 is a perspective view showing a current sensor device according to a fifth embodiment.
Figure 11:
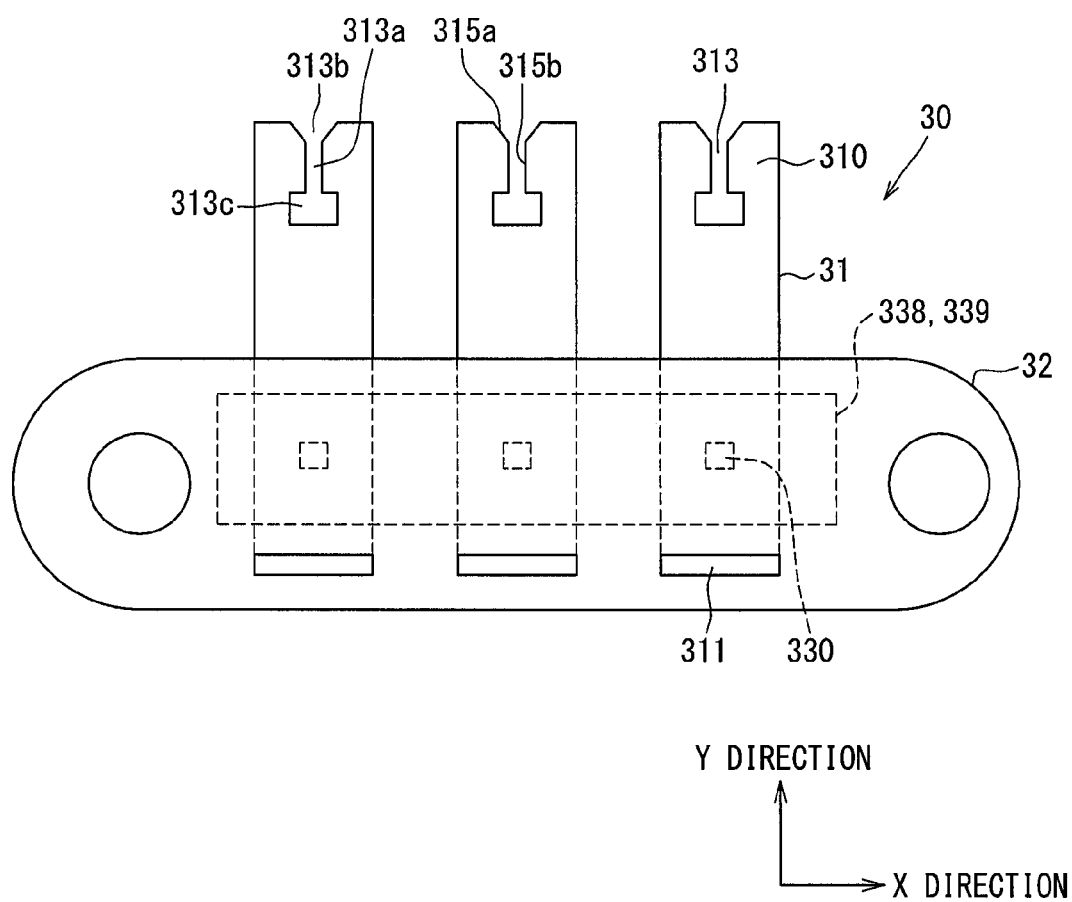
FIG. 11 is a plan view showing the current sensor device.

According to the present embodiment, as shown in FIGS. 10 and 11, the bus bar 31 has a notch 313 as a penetration portion. The notch 313 further includes a wide width portion 313c in addition to a narrow width portion 313a and a wide width portion 313b.

A depth of the notch 313 is substantially equal to a width of the main terminal 25. Like the wide width portion 313b, a width of the wide width portion 313c is also wider than that of the narrow width portion 313a. The wide width portion 313c is continuous with the narrow width portion 313a on the bottom side of the notch 313. As described above, in the current sensor device 30 shown in FIGS. 10 and 11, the wide width portions 313b and 313c are provided at both ends of the narrow width portion 313a in the depth direction so as to sandwich the narrow width portion 313a between them.

As in the second embodiment, in the wide width portion 313b on the opening side to the outer peripheral surface 314, the first wall surface 315a and the second wall surface 315b are tapered. On the other hand, in the wide width portion 313c on the bottom side of the notch 313, the first wall surface 315a and the second wall surface 315b are substantially parallel to each other over the entire length. In other words, the width of the wide width portion 313c is made substantially constant in the depth direction. The width of the wide width portion 313c is set to be substantially equal to the width of the opening portion of the wide width portion 313b to the outer peripheral surface 314.

Unlike the preceding embodiment, the current sensor device 30 integrally includes three bus bars 31 corresponding to three semiconductor devices 21. The semiconductor module 20 including the three semiconductor devices 21 configures, for example, an inverter 12.

Each of the bus bars 31 has a bent portion between one end 310 and the other end 311. Due to the bent portion, a plate thickness direction at one end 310 and a plate thickness direction at the other end 311 have a positional relationship orthogonal to each other. The plate thickness direction of the one end 310 is set to the Z-direction, and the plate thickness direction of the other end 311 is set to the Y-direction.

Figure 12:
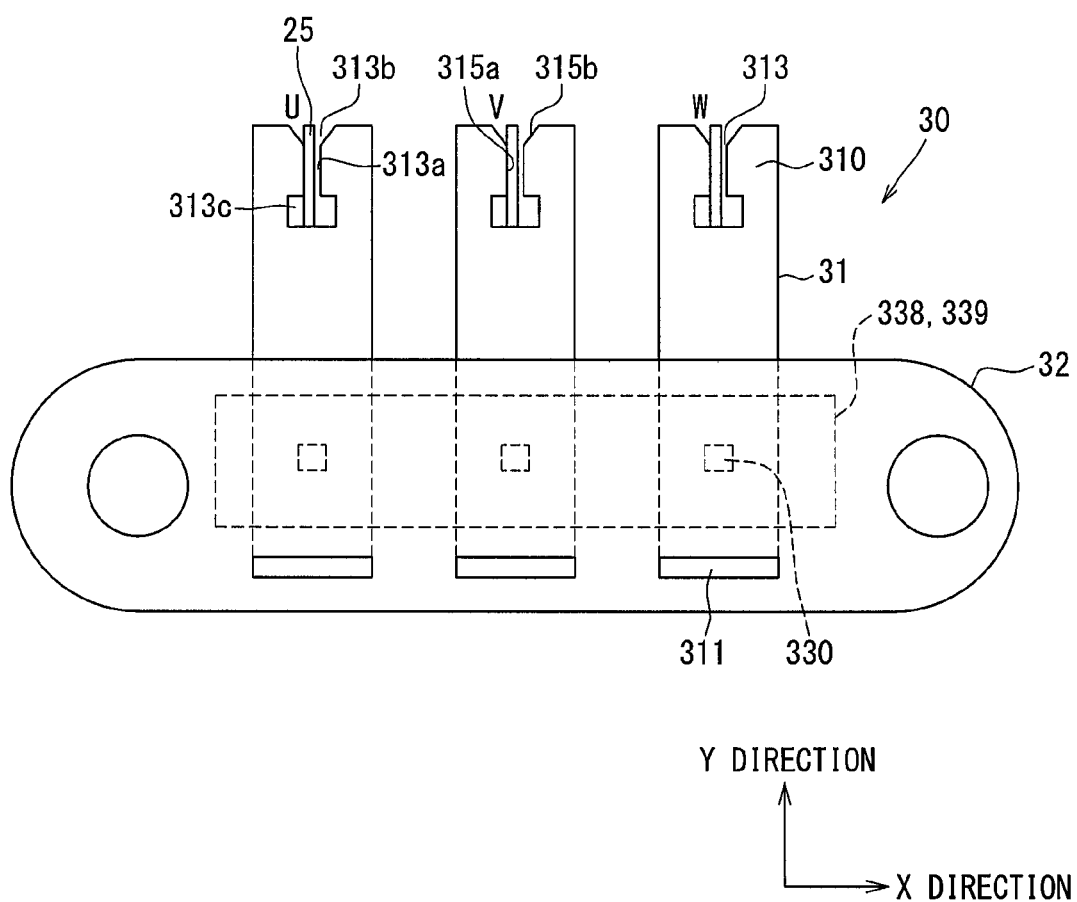
FIG. 12 is a plan view of the connection structure of the semiconductor device and the current sensor device as viewed in the Z-direction.

FIG. 12 shows a state in which the main terminal 25 is connected (welded) to the bus bar 31. For convenience, FIG. 12 illustrates only the main terminal 25 in regard to the semiconductor device 21 (semiconductor module 20). U, V, and W shown in FIG. 12 indicate phases of the inverter 12. Each main terminal 25 is connected to the first wall surface 315a at a corresponding narrow width portion 313a. One end of the main terminal 25 in the width direction is disposed in the wide width portion 313b, and the other end is disposed in the wide width portion 313c. At both ends of the main terminal 25 in the width direction, spaces are defined on both surface sides.

Also in the present embodiment, a notch 313 as a penetration portion is provided in the bus bar 31. Therefore, even if the position of the main terminal 25 varies, the main terminal 25 and the bus bar 31 can be connected (welded) to each other without using a positioning member. Even if the bus bar 31 has a bent portion, the main terminal 25 and the bus bar 31 can be connected to each other without using a positioning member.

In addition, since the wall surface 315 of the notch 313 is a connection surface with the main terminal 25, even if a burr is generated in the bus bar 31, the main terminal 25 and the bus bar 31 can be connected to each other without being affected by the burr.

The burr of the main terminal 25 caused by the press may occur on one surface in the thickness direction in the vicinity of the outer peripheral end. In other words, the burr may occur at both ends of the main terminal 25 in the width direction. On the contrary, according to the present embodiment, the notch 313 has wide width portions 313b and 313c on both sides of the narrow width portion 313a. As a result, even if burrs are generated at both ends of the main terminal 25 in the width direction, the burrs are accommodated in the wide width portions 313b and 313c and come out of contact with the wall surface 315. Therefore, the main terminal 25 and the bus bar 31 can be connected to each other without being affected by the burr of the main terminal 25. In other words, the assembling property of the main terminal 25 and the bus bar 31 can be further improved.

In the present embodiment, the main terminal 25 penetrates through the notch 313 and protrudes from a surface opposite to the surface of the semiconductor device 21 (refer to FIG. 3). This restricts a burr from coming in contact with the wall surface 315 even when the burr is generated at the end portion in the extension direction of the main terminal 25, that is, in the Z-direction. Therefore, the main terminal 25 and the bus bar 31 can be connected to each other without being affected by the burr of the main terminal 25.

Figure 13:
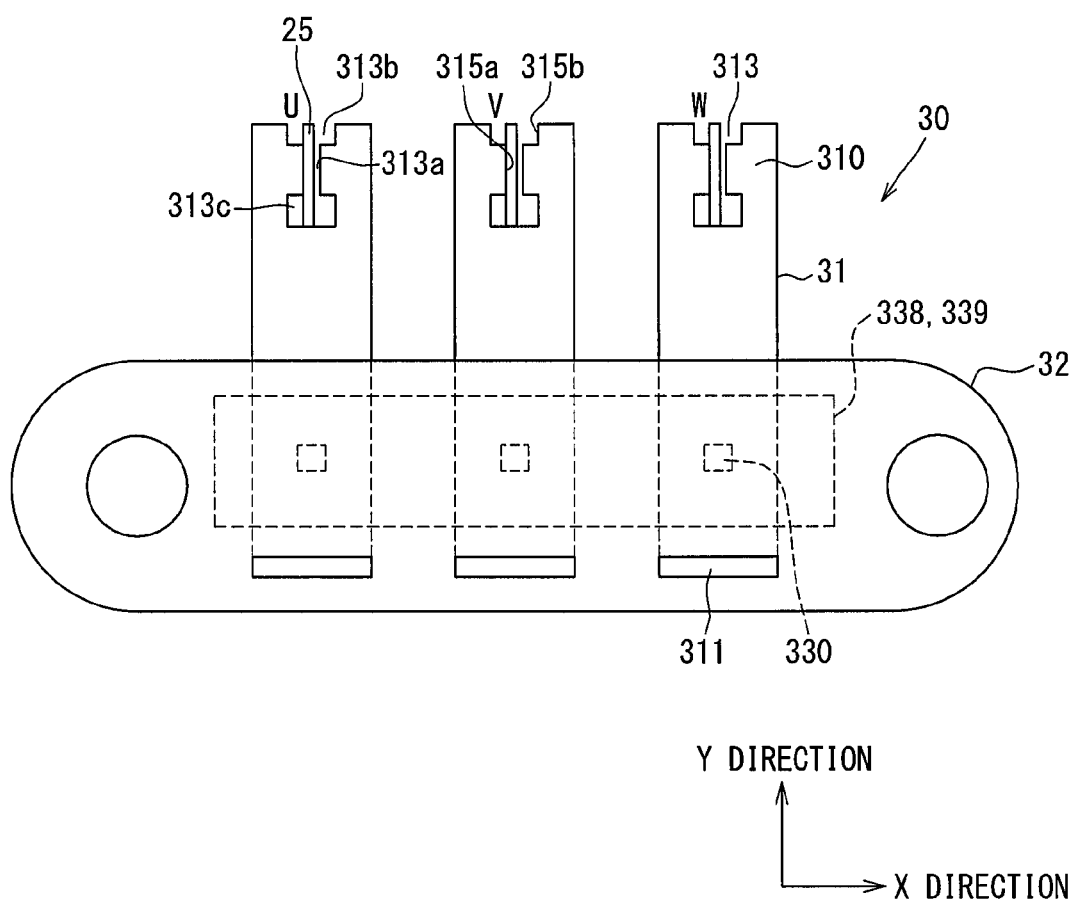
FIG. 13 is a plan view of a connection structure between a current sensor device and a semiconductor device as viewed in the Z-direction according to a modification.

In the wide width portion 313*b*, the first wall surface 315*a* and the second wall surface 315*b* have a tapered shape, but the present disclosure is not limited to the above configuration. Also, the wide width portion 313 *c* is not limited to a constant width. For example, in the modification shown in FIG. 13, the width of the wide width portion 313*b* is kept constant. Even if the wide width portion 313*b* described above is employed, since the spaces are present on both sides of the main terminal 25, the main terminal 25 and the bus bar 31 can be connected to each other without being influenced by the burrs of the main terminal 25. FIG. 13 corresponds to FIG. 12.

The current sensor device 30 including the bus bar 31 having the notch 313 and having no bent portion can also adopt the above configuration. For example, the wide width portion 313*c* may be further added to the second embodiment (refer to FIG. 6).

Sixth Embodiment

The present embodiment can refer to the preceding embodiment. For that reason, a description of portions common to the power conversion device 10, the semiconductor module 20 (the semiconductor device 21), and the current sensor device 30 illustrated in the preceding embodiment will be omitted.

Figure 14:
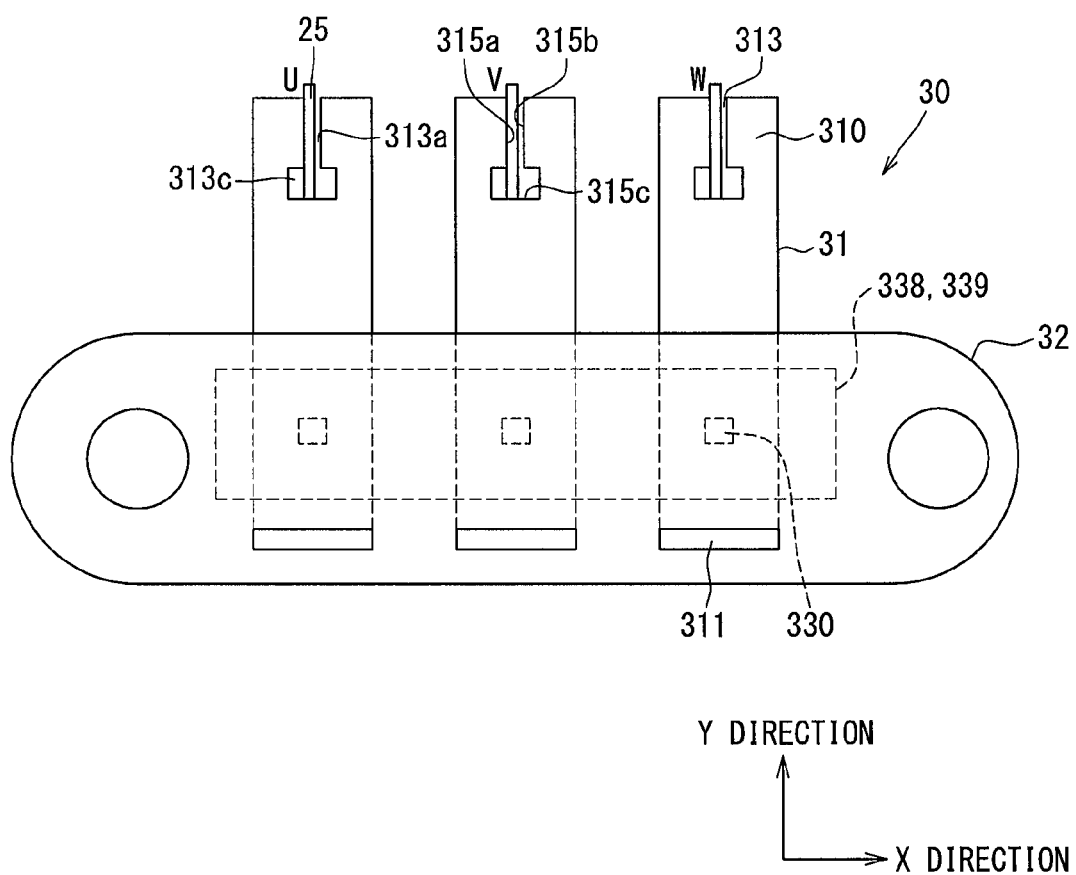
FIG. 14 is a plan view of a connection structure between a current sensor device and a semiconductor device as viewed in the Z-direction according to a sixth embodiment.

In the present embodiment, as shown in FIG. 14, a notch 313 has a narrow width portion 313*a* and a wide width portion 313*c*, and does not have a wide width portion 313*b*. As in the fifth embodiment, a width of the wide width portion 313*c* is kept substantially constant in the depth direction. FIG. 14 corresponds to FIG. 12.

Each main terminal 25 is connected to the first wall surface 315*a* at a corresponding narrow width portion 313*a*. A depth of the notch 313 is shorter than a width of the main terminal 25. For that reason, in a state where one end of the main terminal 25 in the width direction is in contact with the third wall surface 315*c*, the other end of the main terminal 25 protrudes to the outside of the notch 313.

According to the present embodiment, even if a burr is generated at one end of the main terminal 25 in the width direction, specifically, at one end of a bottom side of the notch 313, the burr is accommodated in the wide width portion 313*c* and comes out of contact with a wall surface 315. Also, even if a burr occurs at the other end of the main terminal 25 in the width direction, the burr does not contact the wall surface 315 because it protrudes from the notch 313. Therefore, the main terminal 25 and the bus bar 31 can be connected to each other without being affected by the burr of the main terminal 25. In other words, the assembling property of the main terminal 25 and the bus bar 31 can be further improved.

According to the present embodiment, an example in which the width is kept constant is shown as the wide width portion 313*c*, but the present disclosure is not limited to the above configuration. In addition, the current sensor device 30 including the bus bar 31 having the notch 313 and having no bent portion can also adopt the above configuration.

Seventh Embodiment

The present embodiment can refer to the preceding embodiment. For that reason, a description of portions common to the power conversion device 10, the semiconductor module 20 (the semiconductor device 21), and the current sensor device 30 illustrated in the preceding embodiment will be omitted.

Figure 15:
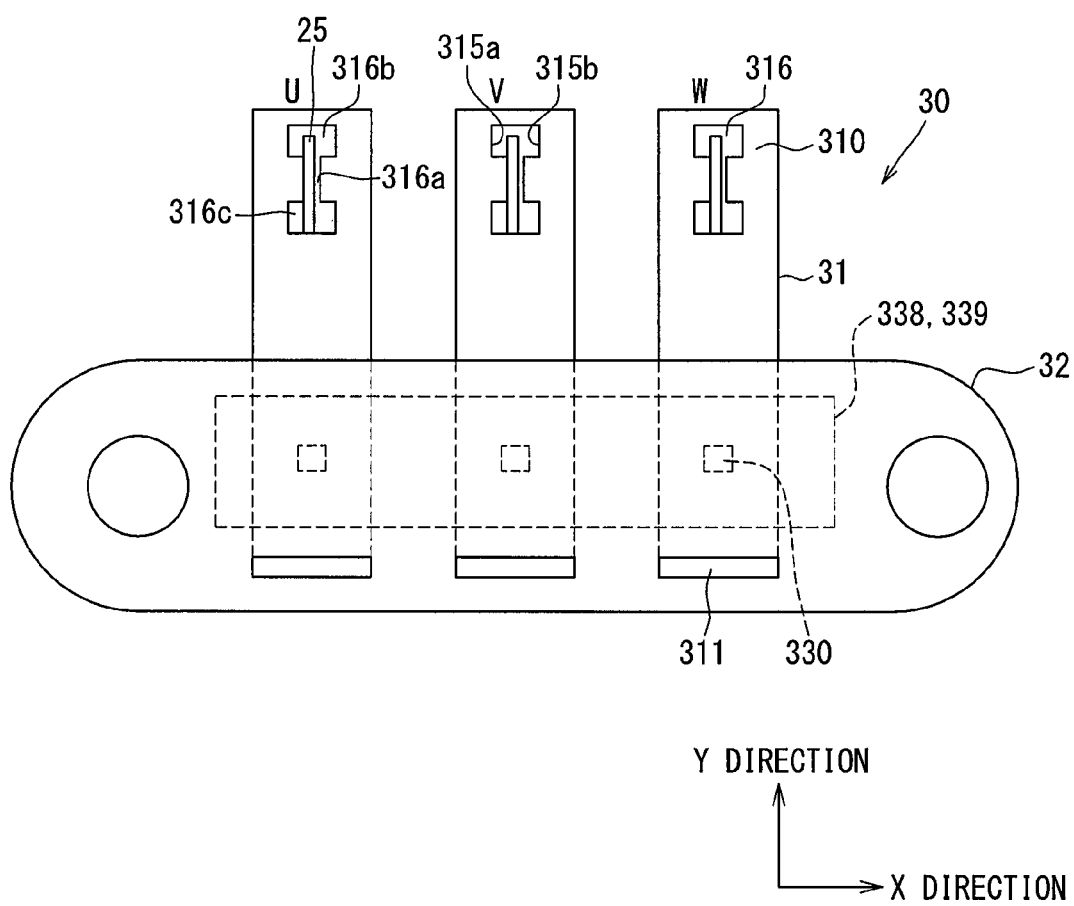
FIG. 15 is a plan view showing a connection structure between a current sensor device and a semiconductor device as viewed in the Z-direction according to a seventh embodiment.

In the present embodiment, as shown in FIG. 15, a bus bar 31 has a through hole 316 as a penetration portion. The through hole 316 has a narrow width portion 316*a* and wide width portions 316*b* and 316*c*.

Like the narrow width portion 313*a*, the narrow width portion 316*a* is a portion having a narrow width between a first wall surface 315*a* and a second wall surface 315*b*. Also in the present embodiment, in the narrow width portion 316*a*, the first wall surface 315*a* and the second wall surface 315*b* are substantially parallel to each other. The through hole 316 is a long hole longer in the Y-direction than in the X-direction. The wide width portion 316*c* is provided at an end portion in the one end 310 of the bus bar 31 on the resin portion 32 side. The wide width portion 316*b* is provided at the end portion of the through hole 316 opposite to the wide width portion 316*c*. The wide width portions 316*b* and 316*c* are provided at both ends of the through hole 316 in the longitudinal direction (Y-direction) so as to sandwich the narrow width portion 316*a* between the enlarged portions 316*b* and 316*c*.

In the wide width portions 316*b* and 316*c*, the first wall surface 315*a* and the second wall surface 315*b* are substantially parallel to each other on the entire surface. In other words, the width of the wide width portion 316*b* is kept substantially constant in the longitudinal direction. The width of the wide width portion 316*c* is also kept substantially constant in the longitudinal direction. The widths of the wide width portions 316*b* and 316*c* are set to be substantially equal to each other.

The main terminal 25 is connected to the first wall surface 315*a* at the narrow width portion 316*a*. One end of the main terminal 25 in the width direction is disposed in the wide width portion 316*b*, and the other end is disposed in the wide width portion 316*c*. In other words, spaces are provided on both surface sides at both ends of the main terminal 25 in the width direction.

As described above, according to the present embodiment, the through hole 316 has the wide width portions 316*b* and 316*c*. As a result, even if burrs are generated at both ends of the main terminal 25 in the width direction, the burrs are accommodated in the wide width portions 316*b* and 316*c* and come out of contact with the wall surface 315. Therefore, the main terminal 25 and the bus bar 31 can be connected to each other without being affected by the burr of the main terminal 25. In other words, the assembling property of the main terminal 25 and the bus bar 31 can be further improved.

Although an example in which the through hole 316 has the wide width portions 316*b* and 316*c* at both ends in the longitudinal direction is described, the present disclosure is not limited to the above configuration. The through hole 316 may have one of the wide width portions 316*b* and 316*c* together with the narrow width portion 316*a*. The wide width portions 316*b* and 316*c* are also not limited to those having a constant width.

In addition, the current sensor device 30 including the bus bar 31 having the through hole 316 and having no bent portion can also adopt the above configuration. For example, at least one of the wide width portions 316b and 316c may be added to the third embodiment (refer to FIG. 7).

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The configuration of the power conversion device 10 is not limited to the above example.

Although an example in which the current sensor device 30 is provided corresponding to the seven semiconductor devices 21 configuring the boost converter 11 and the inverters 12 and 13 has been described, the present disclosure is not limited to the above configuration. For example, the current sensor device 30 may be individually provided for the boost converter 11, the inverter 12, and the inverter 13. The current sensor device 30 may include at least one bus bar 31, the magnetoelectric conversion element 14 (sensor chip 330) provided corresponding to the bus bar 31, and the resin portion 32 that integrally holds the bus bar 31 and the magnetoelectric conversion element 14 (sensor chip 330). In the case of the current sensor device 30 corresponding to the boost converter 11 shown in the present embodiment, the current sensor device 30 includes one bus bar 31 connected to the main terminal 25 of the semiconductor device 21 configuring the boost converter 11.

Although an example in which the plurality of main terminals 25 are all connected to the first wall surface 315a has been described, the present disclosure is not limited to the above configuration. Each of the main terminals 25 may be connected to the second wall surface 315b. Alternatively, a part of the main terminal 25 may be connected to the first wall surface 315a, and the remaining part may be connected to the second wall surface 315b.

What is claimed is:

1. A current sensor device to be disposed on a semiconductor device having a switching element and a plate-shaped terminal electrically connected to the switching element, the current sensor device comprising:
a bus bar that is to be connected to the terminal in a thickness direction of the terminal;
a magnetoelectric conversion element that is configured to detect a current flowing through the bus bar; and
a resin portion that integrally holds the magnetoelectric conversion element and the bus bar, wherein
the bus bar has one end protruding from the resin portion,
the one end of the bus bar includes a penetration portion that is defined by wall surfaces and penetrates through the bus bar in a plate thickness direction of the bus bar,
the wall surfaces include a pair of opposing wall surfaces opposing to each other,
at least one of the pair of opposing wall surfaces is configured to be connected to the terminal,
the penetration portion is a notch that is open to an outer peripheral surface of the bus bar,
the pair of opposing wall surfaces are continuous with the outer peripheral surface of the bus bar, and
the notch includes
a narrow width portion in which a width defined between the pair of opposing wall surfaces is narrow and in which at least one of the opposing wall surfaces is to be connected with the terminal, and
a bottom-side wide width portion which is provided at a bottom end portion of the notch opposite to an open end portion of the notch opening to the outer peripheral surface of the bus bar in a direction orthogonal to both of the direction of the width of the narrow width portion and the plate thickness direction of the bus bar, and
the bottom-side wide width portion has a width defined between the pair of opposing wall surfaces, and the width of the bottom-side wide width portion is greater than the width of the narrow width portion.

2. The current sensor device according to claim 1, wherein the notch further includes an opening-side wide width portion provided at the open end portion of the notch in the direction orthogonal to both of the direction of the width of the narrow width portion and the plate thickness direction of the bus bar, and
in the opening-side wide width portion, at least one of the pair of opposing wall surfaces is tapered so that an opposing distance between the pair of opposing wall surfaces increases toward the outer peripheral surface.

3. The current sensor device according to claim 1, wherein the bus bar has extends from the one end to the other end opposite to the one end keeping the plate thickness direction constant.

4. The current sensor device according to claim 1, wherein the pair of opposing wall surfaces has portions parallel to each other, and
the terminal is to be connected to the parallel portions of the opposing wall surfaces.

5. The current sensor device according to claim 1, wherein the current sensor device is to be disposed for a plurality of the semiconductor devices provided in parallel with each other,
the current sensor device further comprising:
a plurality of the bus bars provided for the respective terminals of the semiconductor devices;
a plurality of the magnetoelectric conversion elements that detect currents flowing through the respective bus bars; and
the resin portion that integrally holds the plurality of the bus bars and the plurality of the magnetoelectric conversion elements, wherein each of the bus bars is provided with the penetration portion.

6. The current sensor device according to claim 5, wherein the plurality of the bus bars are held by the resin portion in a state where the plate thickness directions of the bus bars are the same direction as each other and the bus bars are aligned in a plate width direction orthogonal to the plate thickness direction, and
each of the bus bars has a cutting mark on a surface facing the adjacent bus bar.

7. A current sensor device to be disposed on a semiconductor device having a switching element and a plate-shaped terminal electrically connected to the switching element, the current sensor device comprising:
a bus bar that is to be connected to the terminal in a thickness direction of the terminal;
a magnetoelectric conversion element that is configured to detect a current flowing through the bus bar; and
a resin portion that integrally holds the magnetoelectric conversion element and the bus bar, wherein
the bus bar has one end protruding from the resin portion, the one end of the bus bar includes a penetration portion that is defined by wall surfaces and penetrates through the bus bar in a plate thickness direction of the bus bar, the wall surfaces include a pair of opposing wall surfaces opposing to each other, at least one of the pair of opposing wall surfaces is configured to be connected to the terminal, the penetration portion is a through hole, and the through hole includes
- a narrow width portion in which a width defined between the pair of opposing wall surfaces is narrow and in which at least one of the opposing wall surfaces is to be connected with the terminal, and
- a wide width portion which is provided in at least one of ends of the opening in a direction orthogonal to both of the direction of the width of the narrow width portion and the plate thickness direction of the bus bar, and the wide width portion has a width defined between the pair of opposing wall surfaces, and the width of the wide width portion is greater than the width of the narrow width portion.

8. The current sensor device according to claim 7, wherein the bus bar has extends from the one end to the other end opposite to the one end keeping the plate thickness direction constant.

9. The current sensor device according to claim 7, wherein the pair of opposing wall surfaces has portions parallel to each other, and the terminal is to be connected to the parallel portions of the opposing wall surfaces.

10. The current sensor device according to claim 7, wherein the current sensor device is to be disposed for a plurality of the semiconductor devices provided in parallel with each other, the current sensor device further comprising:
- a plurality of the bus bars provided for the respective terminals of the semiconductor devices;
- a plurality of the magnetoelectric conversion elements that detect currents flowing through the respective bus bars; and
- the resin portion that integrally holds the plurality of the bus bars and the plurality of the magnetoelectric conversion elements, wherein each of the bus bars is provided with the penetration portion.

11. The current sensor device according to claim 10, wherein the plurality of the bus bars are held by the resin portion in a state where the plate thickness directions of the bus bars are the same direction as each other and the bus bars are aligned in a plate width direction orthogonal to the plate thickness direction, and each of the bus bars has a cutting mark on a surface facing the adjacent bus bar.

* * * * *